US011081347B2

(12) United States Patent
Kaneko et al.

(10) Patent No.: US 11,081,347 B2
(45) Date of Patent: *Aug. 3, 2021

(54) METHOD FOR MANUFACTURING SILICON-CARBIDE SEMICONDUCTOR ELEMENT

(71) Applicant: KWANSEI GAKUIN EDUCATIONAL FOUNDATION, Nishinomiya (JP)

(72) Inventors: Tadaaki Kaneko, Sanda (JP); Noboru Ohtani, Sanda (JP); Kenta Hagiwara, Sanda (JP)

(73) Assignee: KWANSEI GAKUIN EDUCATIONAL FOUNDATION, Nishinomiya (JP)

(*) Notice: Subject to any disclaimer, the term of this patent is extended or adjusted under 35 U.S.C. 154(b) by 109 days.

This patent is subject to a terminal disclaimer.

(21) Appl. No.: 15/906,596

(22) Filed: Feb. 27, 2018

(65) Prior Publication Data
US 2018/0233358 A1    Aug. 16, 2018

Related U.S. Application Data

(63) Continuation of application No. 14/897,380, filed as application No. PCT/JP2014/003048 on Jun. 6, 2014, now Pat. No. 9,941,116.

(30) Foreign Application Priority Data

Jun. 13, 2013  (JP) .............................. JP2013-125018

(51) Int. Cl.
*H01L 21/02*  (2006.01)
*H01L 21/67*  (2006.01)
(Continued)

(52) U.S. Cl.
CPC ........ *H01L 21/02529* (2013.01); *C30B 29/36* (2013.01); *C30B 31/22* (2013.01);
(Continued)

(58) Field of Classification Search
CPC ..... H01L 21/76898; H01L 2224/16245; H01L 2224/29147; H01L 2224/29186;
(Continued)

(56) References Cited

U.S. PATENT DOCUMENTS

2005/0001276 A1* 1/2005 Gao ................... H01L 21/0475
257/417
2006/0024969 A1* 2/2006 Shive .................. C04B 41/5338
438/706

(Continued)

FOREIGN PATENT DOCUMENTS

JP    2003-115472 A    4/2003
JP    2004-363326 A    12/2004
(Continued)

OTHER PUBLICATIONS

International Search Report dated Sep. 9, 2014, issued in counterpart International Application No. PCT/JP2014/003048 (3 pages).
(Continued)

*Primary Examiner* — Duy T Nguyen
(74) *Attorney, Agent, or Firm* — Westerman, Hattori, Daniels & Adrian, LLP

(57) ABSTRACT

In this method for manufacturing a semiconductor element, a modified layer produced by subjecting a substrate (70) to mechanical polishing is removed by heating the substrate (70) under Si vapor pressure. An epitaxial layer formation step, an ion implantation step, an ion activation step, and a second removal step are then performed. In the second removal step, macro-step bunching and insufficient ion-implanted portions of the surface of the substrate (70)

(Continued)

performed the ion activation step are removed by heating the substrate (70) under Si vapor pressure. After that, an electrode formation step in which electrodes are formed on the substrate (70) is performed.

17 Claims, 21 Drawing Sheets

(51) Int. Cl.
| | |
|---|---|
| H01L 21/677 | (2006.01) |
| H01L 21/687 | (2006.01) |
| H01L 21/3065 | (2006.01) |
| H01L 21/324 | (2006.01) |
| C30B 29/36 | (2006.01) |
| C30B 31/22 | (2006.01) |
| H01L 21/302 | (2006.01) |
| H01L 29/16 | (2006.01) |
| H01L 29/04 | (2006.01) |
| H01L 21/306 | (2006.01) |
| H01L 21/04 | (2006.01) |

(52) U.S. Cl.
CPC .... *H01L 21/02019* (2013.01); *H01L 21/0262* (2013.01); *H01L 21/02378* (2013.01); *H01L 21/02433* (2013.01); *H01L 21/02623* (2013.01); *H01L 21/02658* (2013.01); *H01L 21/046* (2013.01); *H01L 21/049* (2013.01); *H01L 21/0415* (2013.01); *H01L 21/0475* (2013.01); *H01L 21/0485* (2013.01); *H01L 21/302* (2013.01); *H01L 21/3065* (2013.01); *H01L 21/30625* (2013.01); *H01L 21/324* (2013.01); *H01L 21/67109* (2013.01); *H01L 21/67757* (2013.01); *H01L 21/68764* (2013.01); *H01L 21/68771* (2013.01); *H01L 29/045* (2013.01); *H01L 29/1608* (2013.01)

(58) Field of Classification Search
CPC . H01L 2224/29187; H01L 2224/29188; H01L 2224/2919; H01L 2224/29191; H01L 2224/32245; H01L 2224/73253; H01L 2225/06517; H01L 2225/06541; H01L 2225/06568; H01L 2225/06589; H01L 23/043; H01L 23/053; H01L 23/3738; H01L 23/473; H01L 23/481; H01L 24/17; H01L 24/32; H01L 24/73; H01L 25/0657; H01L 25/073; H01L 25/50; H01L 2924/01029
USPC ........................................................ 438/492
See application file for complete search history.

(56) References Cited

U.S. PATENT DOCUMENTS

| | | | |
|---|---|---|---|
| 2006/0102068 A1 | 5/2006 | Tsvetkov et al. | |
| 2006/0157448 A1* | 7/2006 | Magni ................... | B08B 7/0035 216/67 |
| 2014/0187048 A1* | 7/2014 | Murakami .......... | H01L 21/3081 438/703 |

FOREIGN PATENT DOCUMENTS

| | | |
|---|---|---|
| JP | 2008-16691 A | 1/2008 |
| JP | 2010-265126 A | 11/2010 |
| JP | 2011-233780 A | 11/2011 |
| JP | 2012-176867 A | 9/2012 |
| JP | 2012-193055 A | 10/2012 |

OTHER PUBLICATIONS

Non-Final Office Action dated Sep. 26, 2016, issued in U.S. Appl. No. 14/897,380 (13 pages).
Non-Final Office Action dated Feb. 14, 2017, issued in U.S. Appl. No. 14/897,380 (11 pages).
Non-Final Office Action dated Aug. 4, 2017, issued in U.S. Appl. No. 14/897,380 (10 pages).
Notice of Allowance dated Nov. 27, 2017, issued in U.S. Appl. No. 14/897,380 (8 pages).

* cited by examiner

Fig.4
(a)
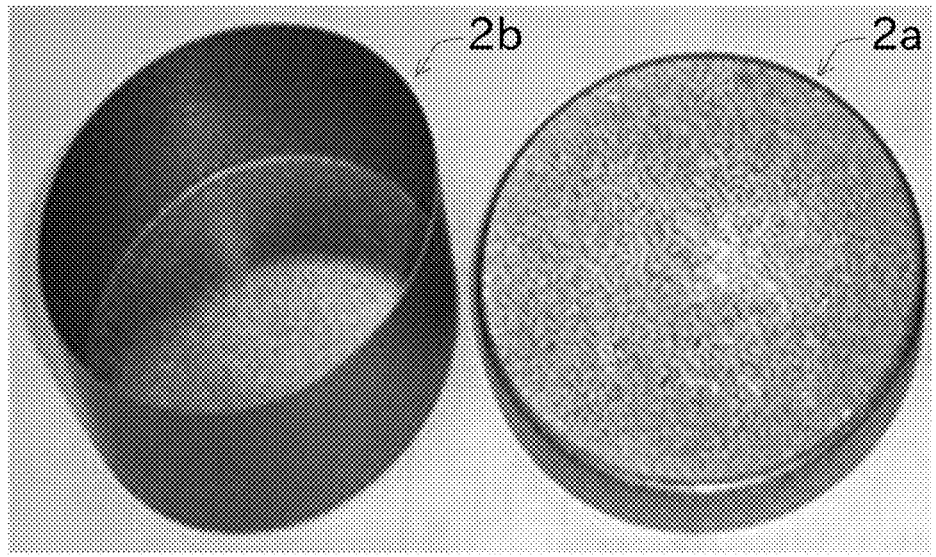
(b)
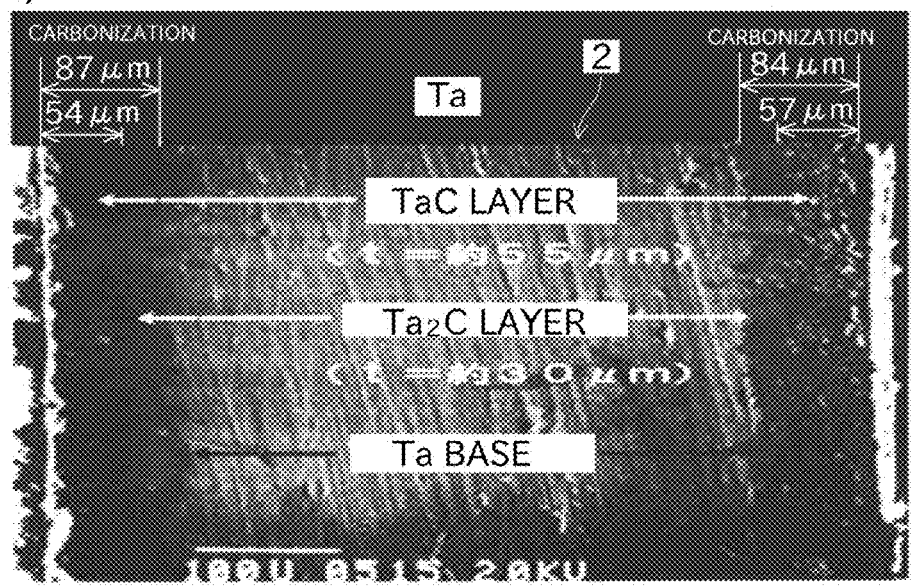

Fig.7
(d) ION IMPLANTATION STEP
CONVENTIONAL TECHNIQUE
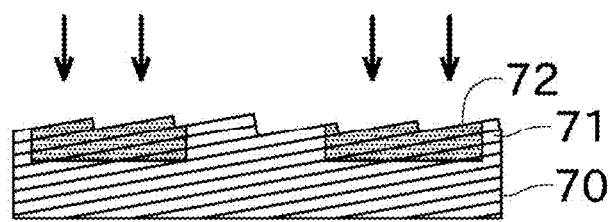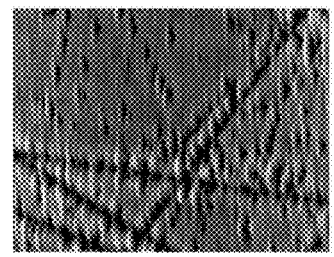
(e) ION ACTIVATION STEP
(HEATING UNDER Si ATMOSPHERE)
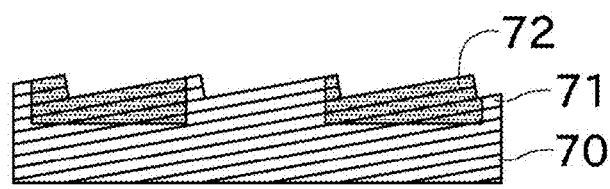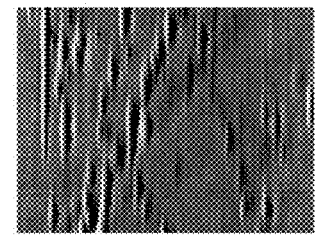

Fig.8
(a) STATUS OF CRUCIBLE WHEN HEATING UNDER Si HIGH PRESSURE ATMOSPHERE
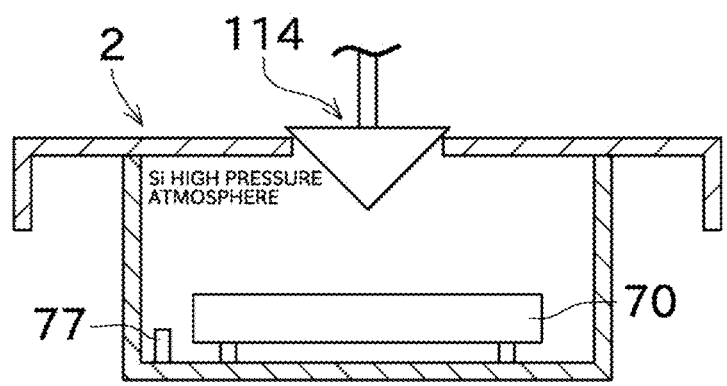
(b) STATUS OF CRUCIBLE WHEN HEATING UNDER Si LOW PRESSURE ATMOSPHERE
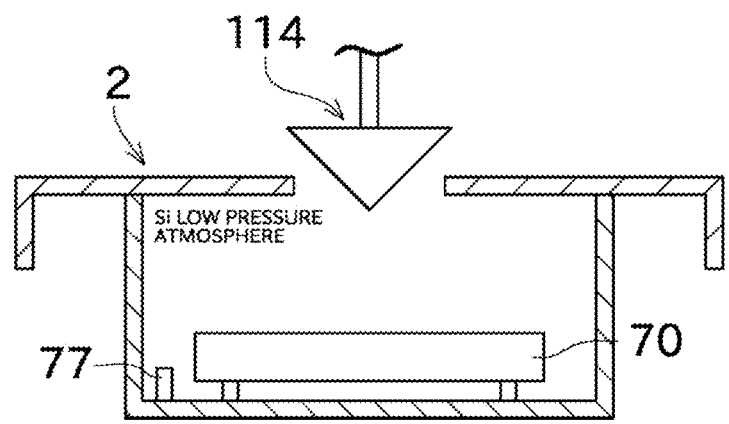

Fig. 9
(a) CUTTING OUT OF OFF-ANGLED SUBSTRATE AND MECHANICAL POLISHING
THIS EMBODIMENT (OFF ANGLE=4°)
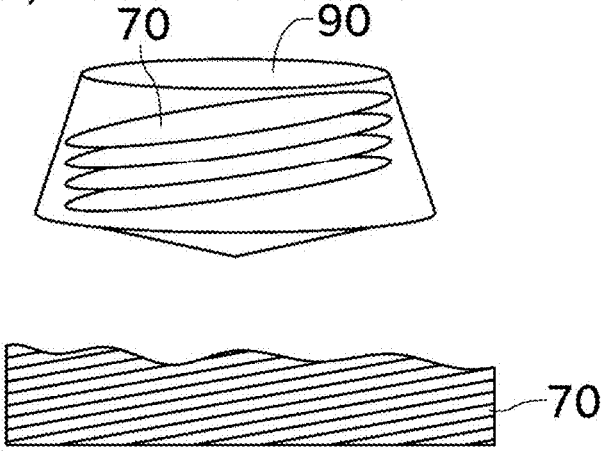
(b) FIRST REMOVAL STEP (HEATING UNDER Si ATMOSPHERE)
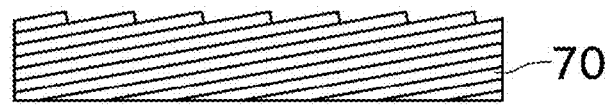
(c) EPITAXIAL LAYER FORMATION STEP (CVD PROCESS)
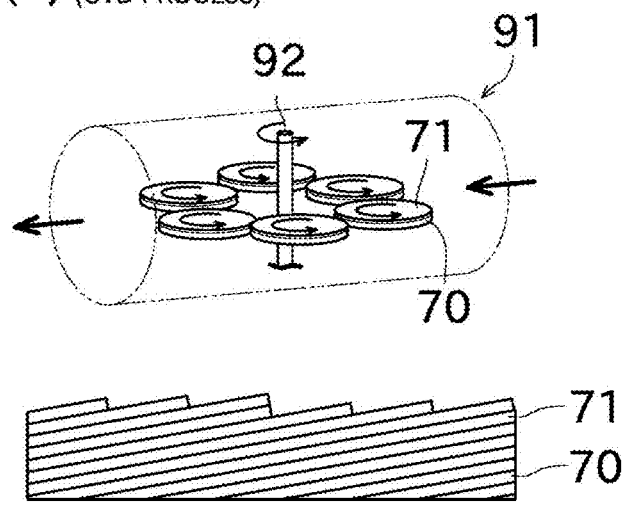

Fig.10
(d) ION IMPLANTATION STEP
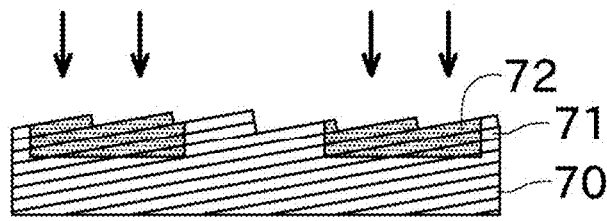
THIS EMBODIMENT
(OFF ANGLE=4°)
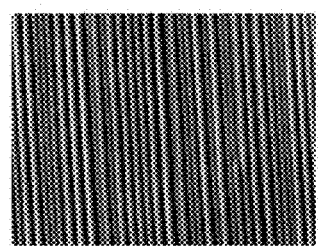
(e) ION ACTIVATION STEP
(HEATING UNDER Si ATMOSPHERE)
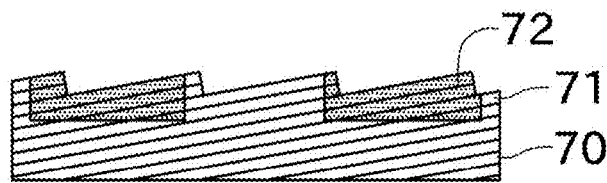
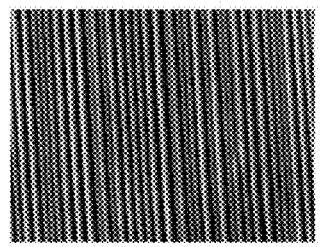
(f) SECOND REMOVAL STEP
(HEATING UNDER Si ATMOSPHERE)
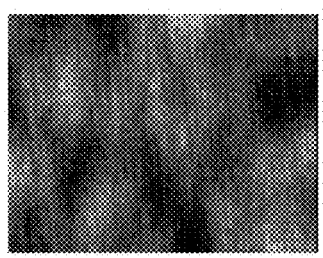
(g) ELECTRODE FORMATION STEP
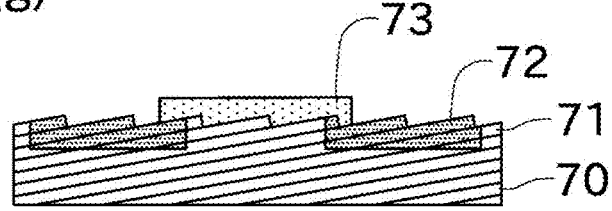
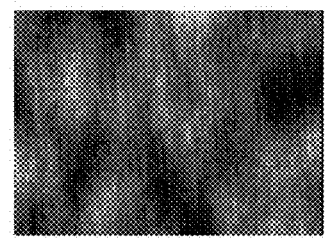

Fig.15
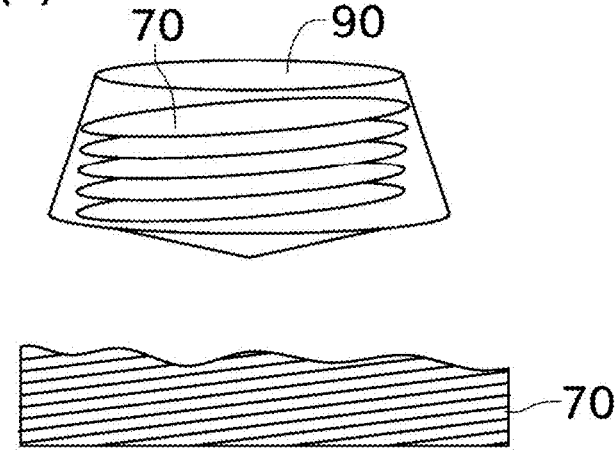
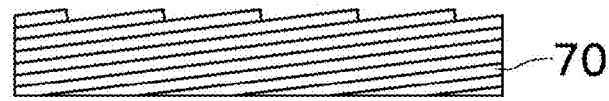
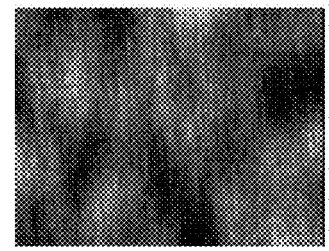
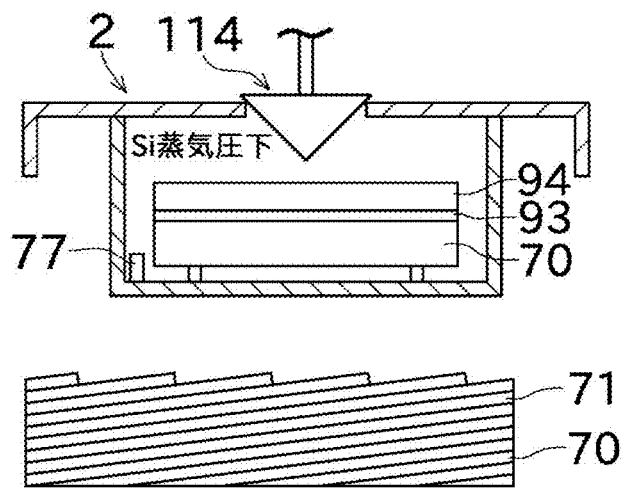
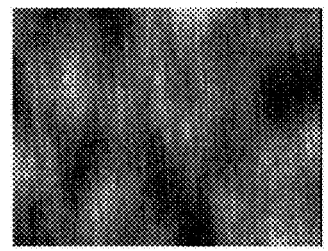

Fig.16
(d) ION IMPLANTATION STEP
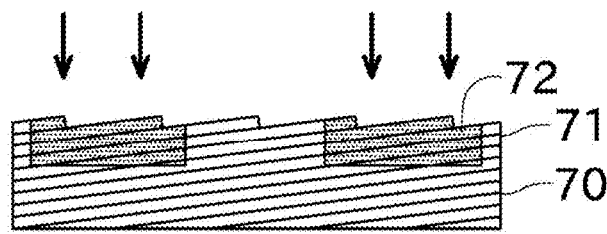
THIS EMBODIMENT
(OFF ANGLE=1°)
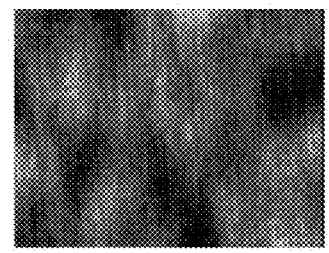
(e) ION ACTIVATION STEP
(HEATING UNDER Si ATMOSPHERE)
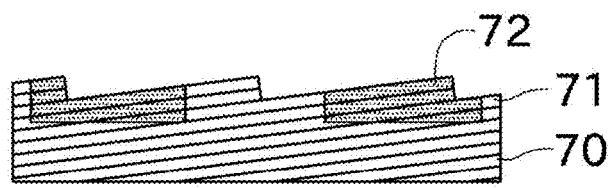
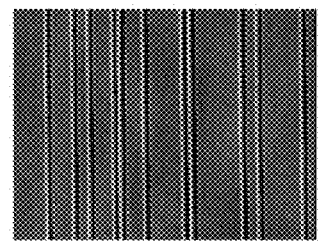
(f) SECOND REMOVAL STEP
(HEATING UNDER Si ATMOSPHERE)
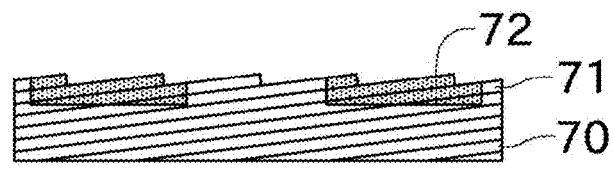
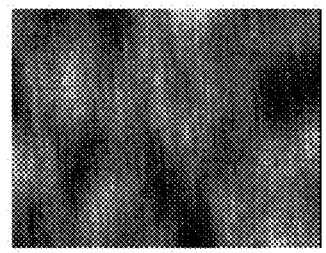
(g) ELECTRODE FORMATION STEP
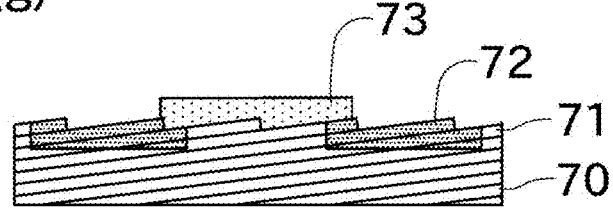
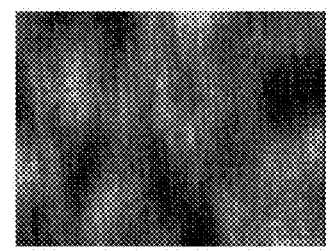

METHOD FOR MANUFACTURING SILICON-CARBIDE SEMICONDUCTOR ELEMENT

CROSS-REFERENCE TO RELATED APPLICATION

This application is a Continuation Application of U.S. application Ser. No. 14/897,380, filed on Dec. 10, 2015, now U.S. Pat. No. 9,941,116 issued on Apr. 10, 2018, which is a national stage application filed under 35 U.S.C. § 371 of International Application No. PCT/JP2014/003048, filed Jun. 6, 2014, which is based upon and claims the benefit of priority of the prior Japanese Patent Application No. 2013-125018, filed on Jun. 13, 2013, the entire contents of which are incorporated herein by reference.

TECHNICAL FIELD

The present invention relates to a method for manufacturing a semiconductor element using a substrate that is made of, at least in a surface thereof, a SiC layer.

BACKGROUND ART

Silicon (Si), gallium arsenide (GaAs), and the like, are conventionally known as a semiconductor material. Recently, the field of use of the semiconductor material is rapidly expanding. The semiconductor material is accordingly more often used under severe environments such as a high temperature environment. Therefore, achievement of the semiconductor material that is able to withstand a high temperature environment is one of important problems from the viewpoint of a reliable operation, processing of a large amount of information, and improvement in the controllability in wide ranges of applications and environments.

Silicon carbide (SiC) is of interest as one of materials that can be used for manufacturing a semiconductor element having an excellent heat resistance. SiC has an excellent mechanical strength and a radiation hardness. Moreover, adding impurities to SiC enables a valence electron such as an electron or a hole to be easily controlled, and SiC is characterized in a wide band gap (about 3.0 eV in 6H single crystal SiC; 3.2 eV in 4H single crystal SiC). This is why SiC is expected as a material for a next-generation power device that achieves a high-temperature resistance, high frequency resistance, high voltage resistance, and high environment resistance, which cannot be achieved by the existing semiconductor material described above. Methods for manufacturing a semiconductor material using SiC are disclosed in Patent Documents 1 to 3.

Patent Document 1 discloses a method for manufacturing a SiC semiconductor having high quality, when generation of SiC polycrystalline is suppressed by uniformizing the temperature in a growth furnace causing a growth of a seed crystal. Patent Document 2 discloses a method for manufacturing a SiC semiconductor having little defect and high quality by forming a plurality of recesses in a seed crystal.

PRIOR-ART DOCUMENTS

Patent Documents

Patent Document 1: Japanese Patent Application Laid-Open No. 2012-193055

Patent Document 2: Japanese Patent Application Laid-Open No. 2012-176867

SUMMARY OF THE INVENTION

Problems to be Solved by the Invention

Meanwhile, a semiconductor material using SiC is manufactured by using a bulk substrate cut out of an ingot, that is made of a single crystal SiC, at a predetermined angle. The surface of the bulk substrate needs to be planarized by mechanical polishing or the like. Since mechanical polishing causes generation of polishing scratches of submicron order, however, the polishing scratches are removed by chemical-mechanical polishing conventionally, and thereby the substrate is further planarized.

After that, an epitaxial layer is formed on the surface of the substrate, and ion-activation is performed by heating at high temperature after ion-implantation. When this treatment is performed on the substrate, however, many latent scratches are exposed on the surface of the substrate. This makes the use of this substrate as a semiconductor element impossible. The applicant of this application analyzed the above-described matter. Then, they found that the cause of this matter is mechanical distortion (hereinafter, called a modified layer) caused by adding the pressure on the surface of the substrate during mechanical polishing.

As shown in FIG. 20, however, this modified layer is produced at a depth of about 10000 nm from the surface of the substrate. Polish rate of chemical-mechanical polishing is about 2 nm/min. Accordingly, it takes a lot of time, 80 hours or more, to remove the modified layer by chemical-mechanical polishing. It takes eighty hours or more in a case of etching by hydrogen gas instead of chemical-mechanical polishing. Thus, in the conventional method, the production efficiency of the semiconductor element is significantly deteriorated. The prior art of the Patent documents 1, 2 or the like do not disclose a method for solving these problems.

The present invention has been made in view of the circumstances described above, and a primary object of the present invention is to provide a method for manufacturing a semiconductor element, which takes short period of time to remove a modified layer produced by subjecting a bulk substrate to mechanical polishing.

Means for Solving the Problems and Effects Thereof

Problems to be solved by the present invention are as described above, and next, means for solving the problems and effects thereof will be described.

In an aspect of the present invention, the following method for manufacturing a semiconductor element using a substrate having an off angle and at least its surface made of a SiC layer is provided. The method for manufacturing the semiconductor element includes a first removal step, an epitaxial layer formation step, an ion implantation step, an ion activation step, a second removal step and an electrode formation step. In the first removal step, a modified layer produced by subjecting the substrate to mechanical polishing is removed by heating the substrate under Si vapor pressure. In the epitaxial layer formation step, an epitaxial layer is formed on the substrate removed the modified layer. In the ion implantation step, ions are implanted in the epitaxial layer. In the ion activation step, ions are activated by heating the substrate. In the second removal step, an insufficient ion-implanted portion of the surface of the substrate performed the ion activation step thereon and a macro-step bunching occurred on the surface of the substrate during the ion activation step are removed by heating under Si vapor pressure. In the electrode formation step, electrodes are formed on the substrate from which the insufficient ion-implanted portion and macro-step bunching are removed by the second removal step.

In the first removal step, removing the modified layer can prevent occurrence of latent scratches. This enables to improve a yield of a semiconductor element. Additionally, since the etching rate (polish rate) is high in the first removal step, the modified layer can be removed in a short time and the production efficiency of the semiconductor element can be improved.

In the first removal step of the method for manufacturing the semiconductor element, heating is preferably performed in a temperature range of 1800° C. or more and 2300° C. or less, and under Si pressure of $10^{-2}$ Pa or more.

Accordingly, the etching rate in the first removal step can be controlled at about 100 nm/min or more. This enables to remove the modified layer in a short time.

In the epitaxial layer formation step of the method for manufacturing the semiconductor element, a chemical vapor deposition process is preferably used for forming an epitaxial layer.

Even in a substrate having a relatively large off angle, the epitaxial layer can be appropriately formed.

In the epitaxial layer formation step of the method for manufacturing the semiconductor element, a liquid-phase epitaxial process is preferably used for forming an epitaxial layer.

Even in a substrate having a relatively small off angle, the epitaxial layer can be appropriately formed.

In the ion activation step of the method for manufacturing the semiconductor element, heating is preferably performed in a temperature range of 1800° C. or more and 2300° C. or less, and under Si pressure of $10^{-3}$ Pa or less.

Since decreasing Si pressure leads to low etching rate, removing the substrate excessively during the ion activation step can be prevented. Heating in the above temperature range enables to get 100% of the ion activation rate.

In the second removal step of the method for manufacturing the semiconductor element, heating is preferably performed in a temperature range of 1600° C. or more and 2000° C. or less, and under Si pressure of $10^{-3}$ Pa or less.

Accordingly, heat treatment under Si pressure within the above-described range is performed, and thereby a portion in which macro-step bunching is formed can be quickly removed and removing an ion-implanted portion excessively can be prevented.

In the method for manufacturing the semiconductor element, the surface of the SiC layer preferably has an off angle of 4 degrees or less in the direction of <11-20>.

In the method for manufacturing the semiconductor element, the surface of the SiC layer preferably has an off angle of 4 degrees or less in the direction of <1-100>.

In the method for manufacturing the semiconductor element, the surface of the SiC layer is preferably terminated at a step having a full-unit height that corresponds to one periodic of SiC molecules in a stack direction or a half-unit height that corresponds to one-half periodic.

Through the above configuration, the surface of the substrate has a high flatness and therefore a semiconductor element with a high quality can be manufactured.

In the method for manufacturing the semiconductor element, it is preferable that the electrode formation step and the second removal step are continuously performed using a common apparatus.

Accordingly, the semiconductor element can be efficiently manufactured.

In the method for manufacturing the semiconductor element, in consideration of the relationship between heating condition including Si pressure, heating temperature and etching rate and the presence or absence of occurrence of macro-step bunching, the heating condition is preferably determined in at least either one of the first removal step or the second removal step.

Accordingly, a desired heating condition is set and macro-step bunching can be reliably removed.

BRIEF DESCRIPTION OF THE DRAWINGS

[FIG. 4] Photographs of an external appearance and a cross-section of a crucible having a carbon getter effect.

[FIG. 7] A diagram showing the latter half of a step of manufacturing a semiconductor element in a conventional technique.

[FIG. 8] A diagram showing (a) the status of performing heat treatment under Si high-pressure atmosphere, and (b) the status of performing heat treatment under Si low-pressure atmosphere.

[FIG. 9] A diagram showing the former half of a step of manufacturing a semiconductor element using a substrate having an off angle of 4° in this embodiment.

[FIG. 10] A diagram showing the latter half of a step of manufacturing a semiconductor element using a substrate having an off angle of 4° in this embodiment.

[FIG. 15] A diagram showing the former half of a step of manufacturing a semiconductor element using a substrate having an off angle of 1° in this embodiment.

[FIG. 16] A diagram showing the latter half of a step of manufacturing a semiconductor element using a substrate having an off angle of 1° in this embodiment.

EMBODIMENT FOR CARRYING OUT THE INVENTION

Next, an embodiment of the present invention will be described.

Figure 1:
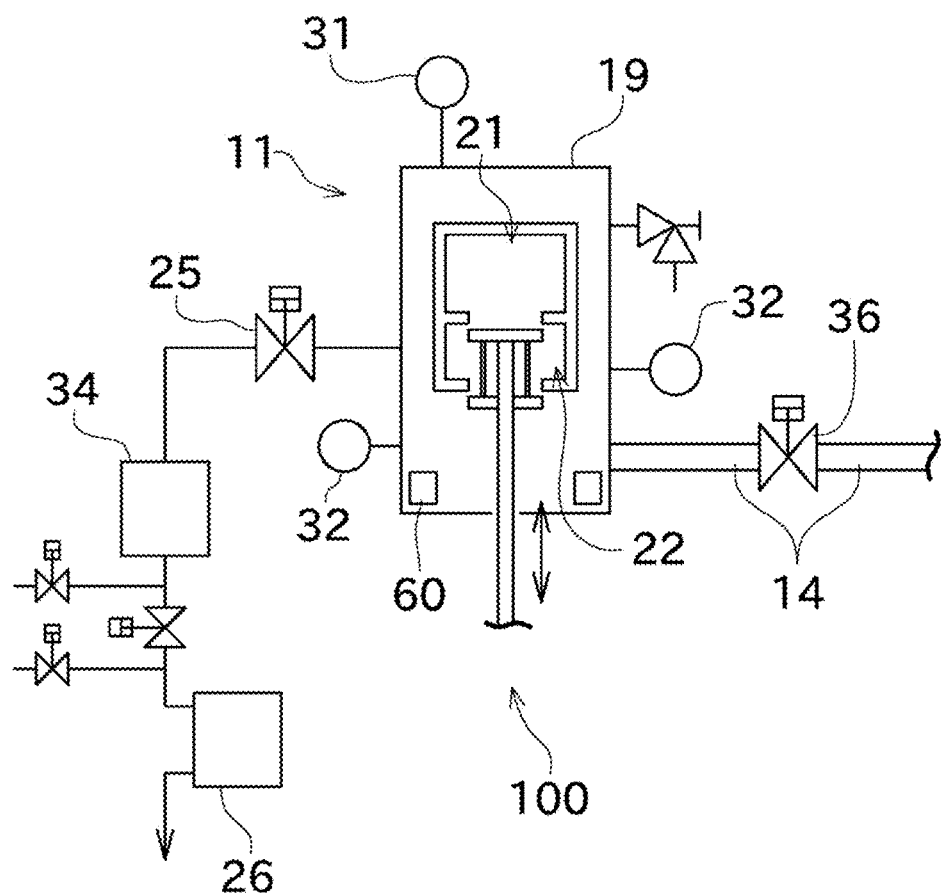
[FIG. 1] A schematic view showing a high-temperature vacuum furnace for use in a heat treatment for manufacturing a semiconductor element.
Figure 2:
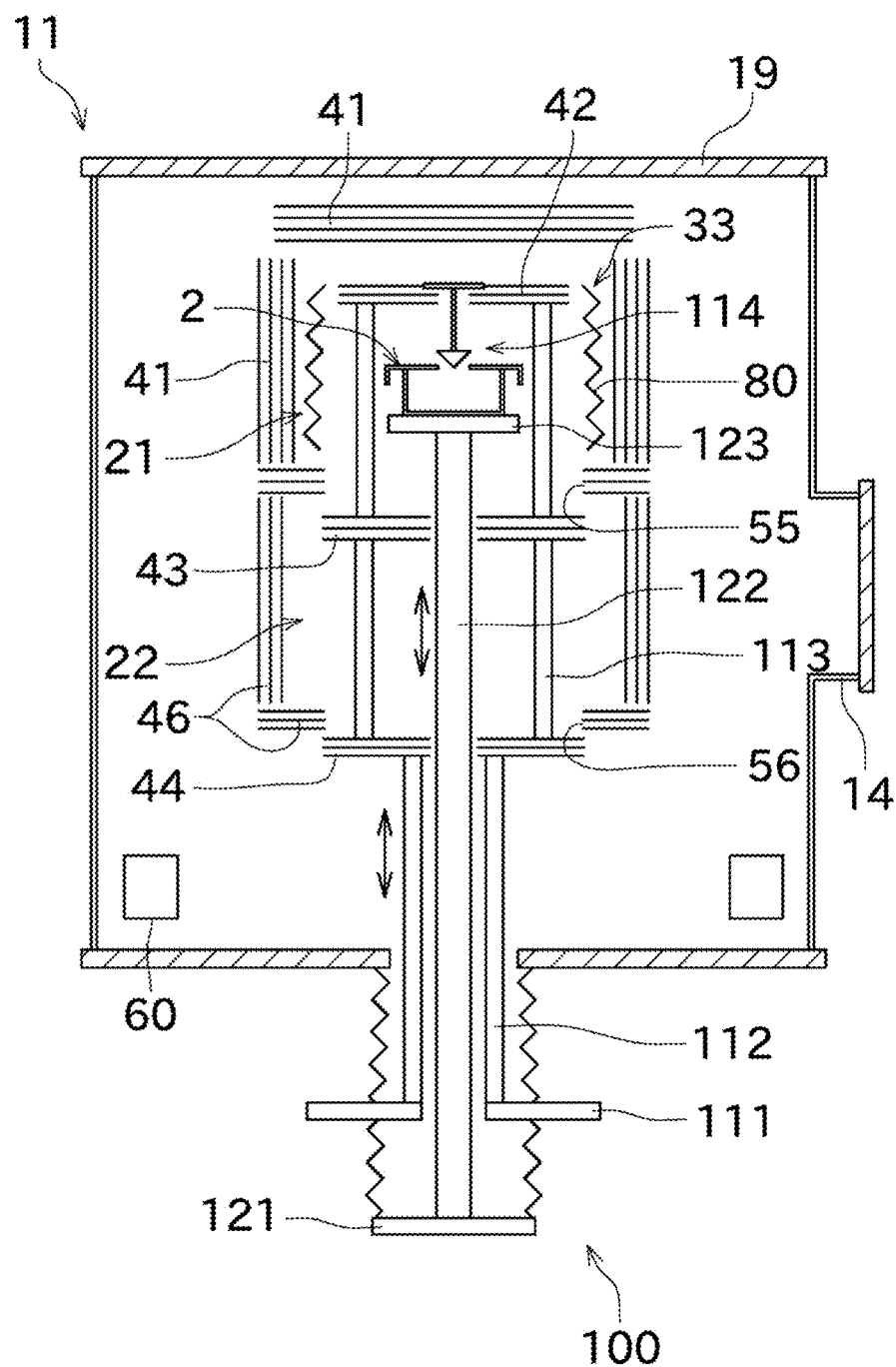
[FIG. 2] A cross-sectional view showing mechanism details of controlling degree of sealing of a crucible in a main heating chamber of a high-temperature vacuum furnace.
Figure 3:
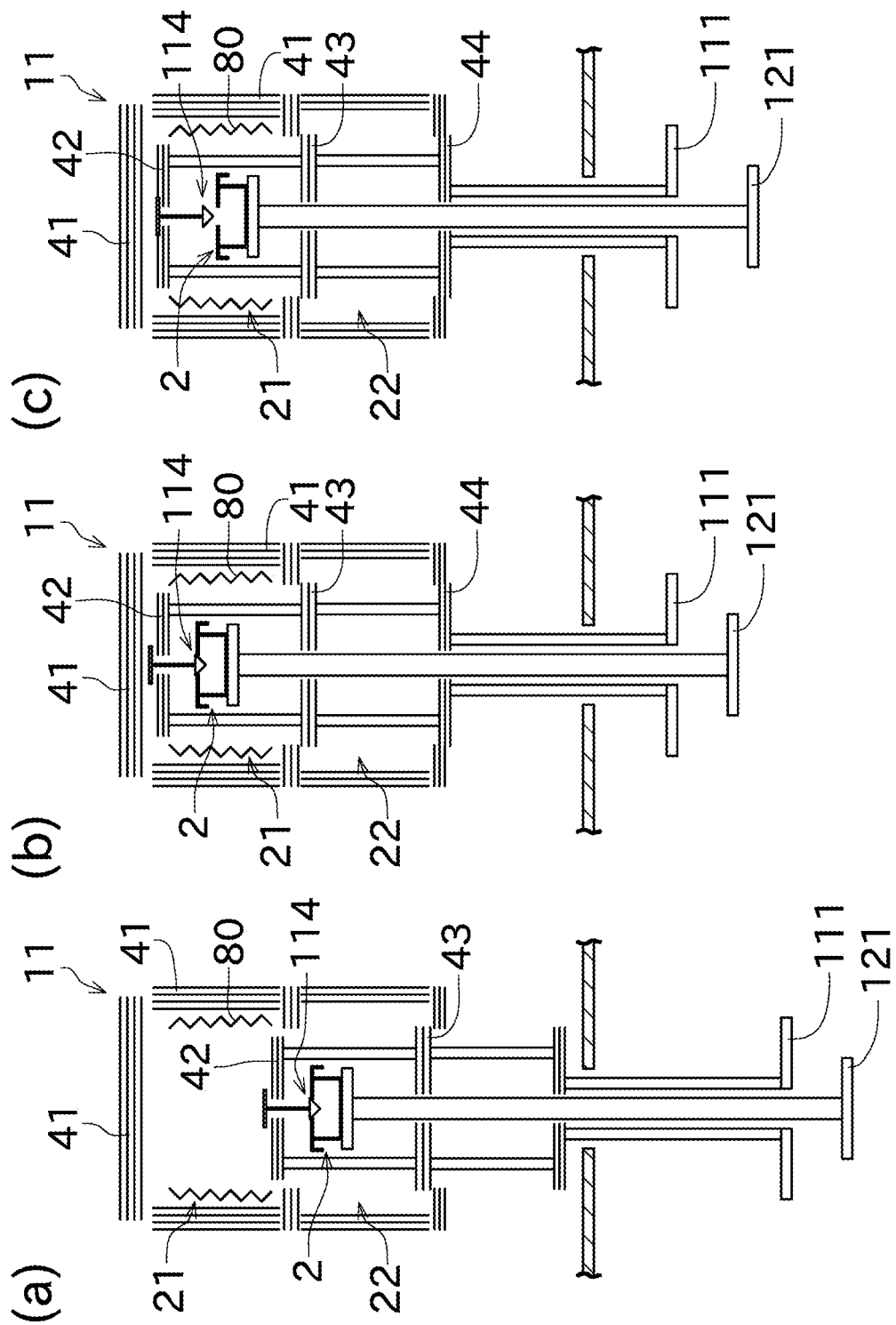
[FIG. 3] (a) A cross-sectional front elevation view of a high-temperature vacuum furnace in a case that a crucible is in a preheating chamber. (b) a cross-sectional front elevation view of a high-temperature vacuum furnace in a case that a sealed crucible is in a heating chamber. (c) a cross-sectional front elevation view of a high-temperature vacuum furnace in a case that a opened crucible is in a heating chamber.

A high-temperature vacuum furnace (heating furnace) 11 and a crucible (storing container) 2 used for manufacturing a semiconductor element will be described. FIG. 1 is a schematic view showing a high-temperature vacuum furnace for use in a heat treatment for manufacturing a semiconductor element. FIG. 2 is a cross-sectional view showing mechanism details of controlling degree of sealing of a crucible in a main heating chamber of the high-temperature vacuum furnace. FIG. 3 is a cross-sectional front elevation view of the arrangement of the crucible and the like in the high-temperature vacuum furnace 11.

As shown in FIG. 1 and FIG. 2, the high-temperature vacuum furnace 11 includes a main heating chamber 21 and a preheating chamber 22. The main heating chamber 21 enables a processing object stored in a crucible 2 to be heated to a temperature of 1000° C. or more and 2300° C. or less. The preheating chamber 22 enables a processing object to be preheated to a temperature of 500° C. or more. The preheating chamber 22 is arranged below the main heating chamber 21, and adjacent to the main heating chamber 21 with respect to the vertical direction.

The high-temperature vacuum furnace 11 includes a vacuum chamber 19. The main heating chamber 21 and the preheating chamber 22 are arranged inside the vacuum chamber 19. A turbo-molecular pump 34 serving as a vacuum-producing apparatus is connected to the vacuum chamber 19, so that a vacuum of, for example, $10^{-2}$ Pa or less, and desirably $10^{-7}$ Pa or less, can be produced inside the vacuum chamber 19. A gate valve 25 is interposed between the turbo-molecular pump 34 and the vacuum chamber 19. An auxiliary rotary pump 26 is connected to the turbo-molecular pump 34.

A vacuum meter 31 for measuring the degree of vacuum and a mass spectrometry apparatus 32 for performing mass spectrometry are provided in the high-temperature vacuum furnace 11. The vacuum chamber 19 is connected via a transport path 14 to a stock storage (not shown) for storing processing objects. The transport path 14 can be opened and closed by a gate valve 36.

The main heating chamber 21, whose cross-section has a regular nonagonal shape in a plan view, is arranged in an upper portion of an internal space of the vacuum chamber 19. As shown in FIG. 2, a heating apparatus 33 is provided in the main heating chamber 21. The heating apparatus 33 has a mesh heater (heater) 80 arranged so as to surround the main heating chamber 21 and a power source and the like for applying current to the mesh heater 80. The heating apparatus 33 adjusts current applying to the mesh heater 80 based on the detected result of a temperature detector (not shown). This enables to control temperature distribution accurately within the main heating chamber 21. A first multi-layer heat reflection metal plate 41 is fixed to a sidewall and a ceiling of the main heating chamber 21. At least one of first multi-layer heat reflection metal plates 41 is configured to reflect heat generated from the mesh heater 80 toward a central area of the main heating chamber 21.

As a result, a layout in which the mesh heater 80 surrounds a processing object which is an object of a heat treatment and the multi-layer heat reflection metal plate 41 is arranged further outside the mesh heater 80 is achieved in the main heating chamber 21. This enables the processing object to be strongly and uniformly heated, and its temperature to be raised up to 1000° C. or more and 2300° C. or less.

The ceiling side of the main heating chamber 21 is closed by the first multi-layer heat reflection metal plate 41. The first multi-layer heat reflection metal plate 41 arranged on a bottom surface of the main heating chamber 21 has an opening 55. The crucible 2 is movable through at least one opening 55 between the main heating chamber 21 and the preheating chamber 22 arranged below and adjacent to the main heating chamber 21.

The preheating chamber 22 is formed by at least one multi-layer heat reflection metal plate 46 enclosing a space existing below the main heating chamber 21. The preheating chamber 22 has a circular cross-section in a plan view. Heating means such as the mesh heater 33 is not provided in the preheating chamber 22.

The multi-layer heat reflection metal plate 46 that defines a sidewall of the preheating chamber 22 has an open/close member (not shown). The open/close member is positioned at a location opposed to the transport path 14. The open/close member enables to switch between the conditions which the crucible 2 can be transported with a passage hole formed at a location opposed to the transport path 14 and which heat treatment can be performed with the passage hole closed.

As shown in FIG. 2, the multi-layer heat reflection metal plate 46 arranged on a bottom surface of the preheating chamber 22 has at least one opening 56.

The high-temperature vacuum furnace 11 includes a moving mechanism 100 for vertically moving the crucible 2. The moving mechanism 100 is configured to move the crucible 2 independently and vertically between a first support member 111 and a second support member 121.

A first elevation shaft 112 is connected to an upper portion of a first support member 111. A fourth multi-layer heat reflection metal plate 44 is arranged at an upper portion of the first elevation shaft 112. The fourth multi-layer heat reflection metal plate 44, a third multi-layer heat reflection metal plate 43 positioned at an upper side thereof, and a second multi-layer heat reflection metal plate 42 positioned at a further upper side thereof are spaced apart from one another and are coupled to one another by column portions 113 that is provided vertically. A lid (adjustment mean) 114 is mounted on the second multi-layer heat reflection metal plate 42 for adjusting the degree of sealing of the crucible 2. The lid 114 is located at an upper side of a tray 123 which will be described later. The stacked number of the second multi-layer heat reflection metal plates 42 is less than the number of the first multi-layer heat reflection metal plates 41 stacked in the main heating chamber 21.

On the other hand, a second elevation shaft 122 is connected to an upper portion of a second support member 121. The second elevation shaft 122 is arranged so as to be inserted into a hole formed at the center of the third multi-layer heat reflection metal plate 43 and the fourth multi-layer heat reflection metal plate 44. The second elevation shaft 122 is movable relative to the third multi-layer heat reflection metal plate 43 and the fourth multi-layer heat reflection metal plate 44. The tray 123 made of tungsten for placing the crucible 2 is connected to an upper end portion of the second elevation shaft 122. A hole is formed at an upper portion of the crucible 2 used in this embodiment. Changing the positional relationship between the hole and the lid 114 enables to adjust the degree of sealing of the crucible 2.

As shown in FIG. 2, a shroud 60 is arranged below the fourth multi-layer heat reflection metal plate 44. Liquid nitrogen circulates through the shroud 60. Unnecessary gas discharged from the main heating chamber 21 is adsorbed to the surface of 60 in contacting with the shroud 60, and unnecessary gas is successfully discharged from the main heating chamber 21. This enables to keep the degree of vacuum in the main heating chamber 21.

A description of an example will be given of a flow of heat treatment performed by the above-described configuration of the high-temperature vacuum furnace 11. Firstly, the crucible 2 storing a processing object is introduced into the vacuum chamber 19 through the transport path 14, and placed on the tray 123 arranged in the preheating chamber 22 (see FIG. 3 (a)). In this condition, the heating apparatus 33 is driven, so that the main heating chamber 21 is heated to a predetermined temperature of 1000° C. or more and 2300° C. or less (for example, about 1800° C.). At this time, by driving the turbo-molecular pump 34, the pressure in the vacuum chamber 19 is adjusted to $10^{-2}$ Pa or less, and preferably $10^{-7}$ Pa or less.

As mentioned above, the stacked number of the second multi-layer heat reflection metal plates 42 is less than the stacked number of the first multi-layer heat reflection metal plates 41. Therefore, part of the heat generated by the mesh heater 80 of the heating apparatus 33 can be moderately supplied (distributed) to the preheating chamber 22 via the second multi-layer heat reflection metal plates 42 so that the processing object placed in the preheating chamber 22 is preheated to a predetermined temperature of 500° C. or more (for example, 800° C.). Thus, preheating is achieved even though no heater is provided in the preheating chamber 22, and a simple structure of the preheating chamber 22 is achieved.

After the above-mentioned preheating treatment is performed for a predetermined time period, the first support member 111 and the first elevation shaft 112 are moved up. As a result, the crucible 2 passes through the opening 55, and moves into the main heating chamber 21, and then the main heating chamber 21 is closed by the third multi-layer heat reflection metal plates 43. This allows the heat treatment to be started immediately, and the temperature of the processing object placed in the main heating chamber 21 can be rapidly raised to a predetermined temperature (about 1800° C.). At this time, the second support member 121 is moved up and down so that the degree of sealing of the crucible 2 is changed. This enables to adjust the inside pressure of the crucible 2 (the detail will be described later).

Any of the above shown multi-layer heat reflection metal plates 41 to 44, 46 is structured such that metal plates (made of tungsten) are stacked with predetermined intervals therebetween.

Any material is adoptable for the multi-layer heat reflection metal plates 41 to 44, 46, as long as the material has sufficient heating characteristics relative to thermal radiation of the mesh heater 80 and the melting point of the material is higher than the ambient temperature. For example, not only the tungsten, but also a metal material having a high melting point, such as tantalum, niobium, and molybdenum, is adoptable for the multi-layer heat reflection metal plates 41 to 44, 46. Alternatively, a carbide such as tungsten carbide, zirconium carbide, tantalum carbide, hafnium carbide, and molybdenum carbide is adoptable for the multi-layer heat reflection metal plates 41 to 44, 46. It may be also acceptable that an infrared reflective coating made of gold, tungsten carbide, or the like, is further formed on reflecting surfaces of the multi-layer heat reflection metal plates 41 to 44, 46.

Figure 5:
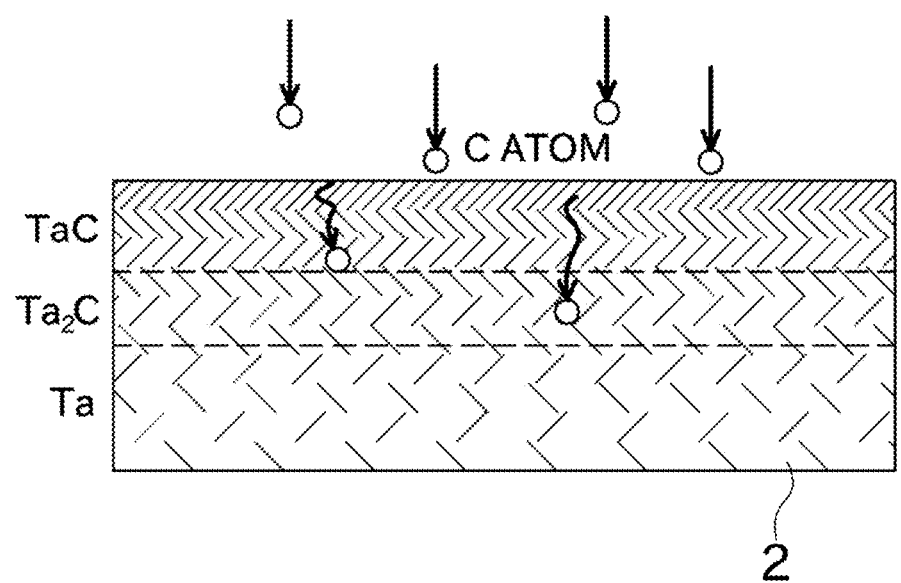
[FIG. 5] A schematic view for explanation of a carbon getter effect.

Next, the crucible 2 will be described with reference to FIG. 4 and FIG. 5. FIG. 4 shows photographs of an external appearance and a cross-section of a crucible having a carbon getter effect. FIG. 5 is a schematic view for explanation of the carbon getter effect. As shown in FIG. 4 (a), the crucible 2 is a fitted casing including an upper casing 2a and a lower casing 2b that are fittable to each other. The crucible 2 is configured to exert a carbon getter effect, which will be described later, in a case of performing a high temperature treatment in a vacuum environment. More specifically, the crucible 2 is made of tantalum metal, and includes a tantalum carbide layer that is exposed to an internal space of the crucible 2.

In more detail, as shown in FIG. 4 (b), the crucible 2 includes a TaC layer formed in a most superficial layer, a $Ta_2C$ layer formed inner than the TaC layer, and tantalum metal, which serves as a base material, arranged further inner than the $Ta_2C$ layer. Since the state of bonding between tantalum and carbon exhibits a temperature dependency, the crucible 2 is configured such that TaC having a high carbon concentration is arranged in a most superficial portion, $Ta_2C$ having a relatively less carbon concentration is arranged inside TaC, and tantalum metal serving as the base material, whose carbon concentration is zero, is arranged further inside $Ta_2C$.

As described above, the surface of the crucible 2 is covered with a tantalum carbide layer (TaC layer), that is exposed to an internal space of the crucible 2. Accordingly, as long as the high temperature treatment is performed in a vacuum environment as described above, the crucible 2 exerts a function for continuous adsorption and intake of carbon atoms from a surface of the tantalum carbide layer, as shown in FIG. 5. In this sense, it can be said that the crucible 2 of this embodiment has a carbon atom adsorption ion pump function (ion getter function). Thus, in silicon vapor and silicon carbide vapor contained in the atmosphere within the crucible 2 during the heat treatment, only carbon is selectively adsorbed and stored in the crucible 2. This can keep a high purity silicon atmosphere within the crucible 2.

In this embodiment, the high-temperature vacuum furnace 11 and the crucible 2 having the above-described configurations are used for manufacturing a semiconductor element from a substrate. In the following description, a heat treatment using the above-described high-temperature vacuum furnace 11 will be referred to simply as, for example, a heat treatment.

Figure 6:
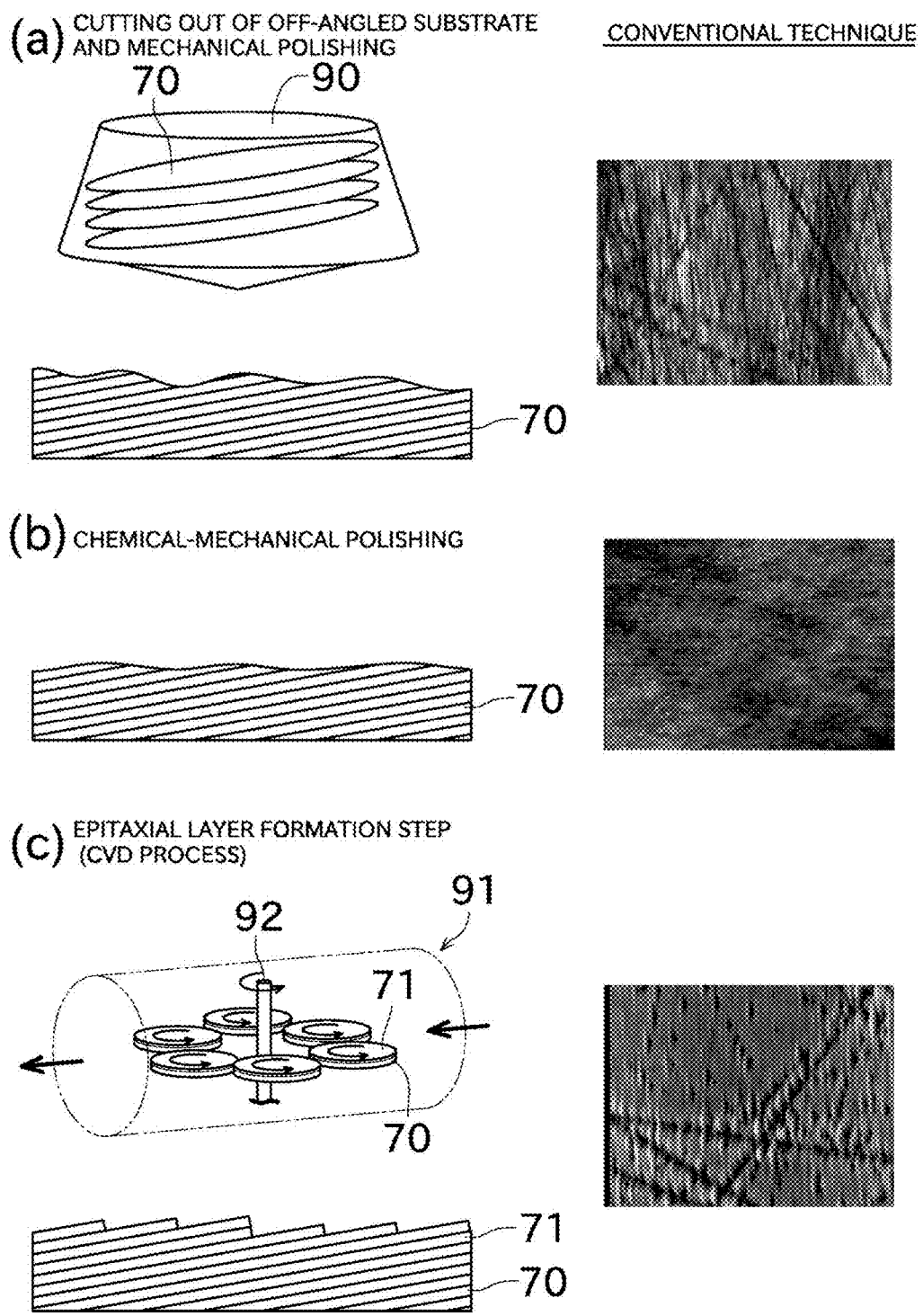
[FIG. 6] A diagram showing the former half of a step of manufacturing a semiconductor element in a conventional technique.

Next, a method for manufacturing a semiconductor element will be described. Firstly, the conventional manufacturing method and the problems thereof will be described. FIG. 6 and FIG. 7 are diagrams showing a manufacturing step of the semiconductor element in a conventional technique. A substrate 70 in FIG. 6 or the like is schematically shown in a cross-sectional view of the substrate.

An ingot 90 including a 4H—SiC single crystal or 6H—SiC single crystal is cut out at a predetermined thickness so that a bulk substrate which is used for manufacturing the semiconductor element can be obtained. Particularly, cutting obliquely out of the ingot 90 enables to obtain a substrate 70 having an off-angle. After that, mechanical polishing is performed on the substrate 70 for removing unevenness of the surface of the substrate 70. As shown in a photomicrograph of FIG. 6 (a), a plurality of polishing scratches is formed on the surface of the substrate 70 after performing the mechanical polishing.

Therefore, chemical-mechanical polishing has been conventionally used as the method for further planarizing the substrate 70. Chemical-mechanical polishing is a polishing method, which more efficiently exerts an effect of mechanical polishing more efficiently by chemical action included in polishing liquid or surface chemical action having polishing agent and forms the surface more planarized than the surface performed mechanical polishing. As shown in a photomicrograph of FIG. 6 (b), performing chemical-mechanical polishing allows the surface of the substrate 70 to be successful on appearance.

Next, an epitaxial layer formation step using a CVD process is performed. In this method, the epitaxial layer 71 is formed by using the CVD process and an off angle on the surface of the substrate 70. The CVD process uses a susceptor 91 or the like, for example, shown in FIG. 6 (c). The susceptor 91 is the apparatus for supporting and heating the substrate 70. The susceptor 91 can simultaneously support a plurality of substrates 70, individually rotate each of substrate 70, and also collectively rotate the plurality of substrates 70 around a rotation shaft 92. This configuration allows to heat the substrates 70 uniformly. The heat treatment is preferably performed in a temperature range of 1200° C. or more and 1600° C. or less.

The substrate 70 is heated while emitting raw material gas in the direction shown by the arrow in FIG. 6(c). This enables to form the epitaxial layer 71 including SiC single crystal (4H—SiC single crystal or 6H—SiC single crystal) on the surface of the substrate 70.

Figure 20:
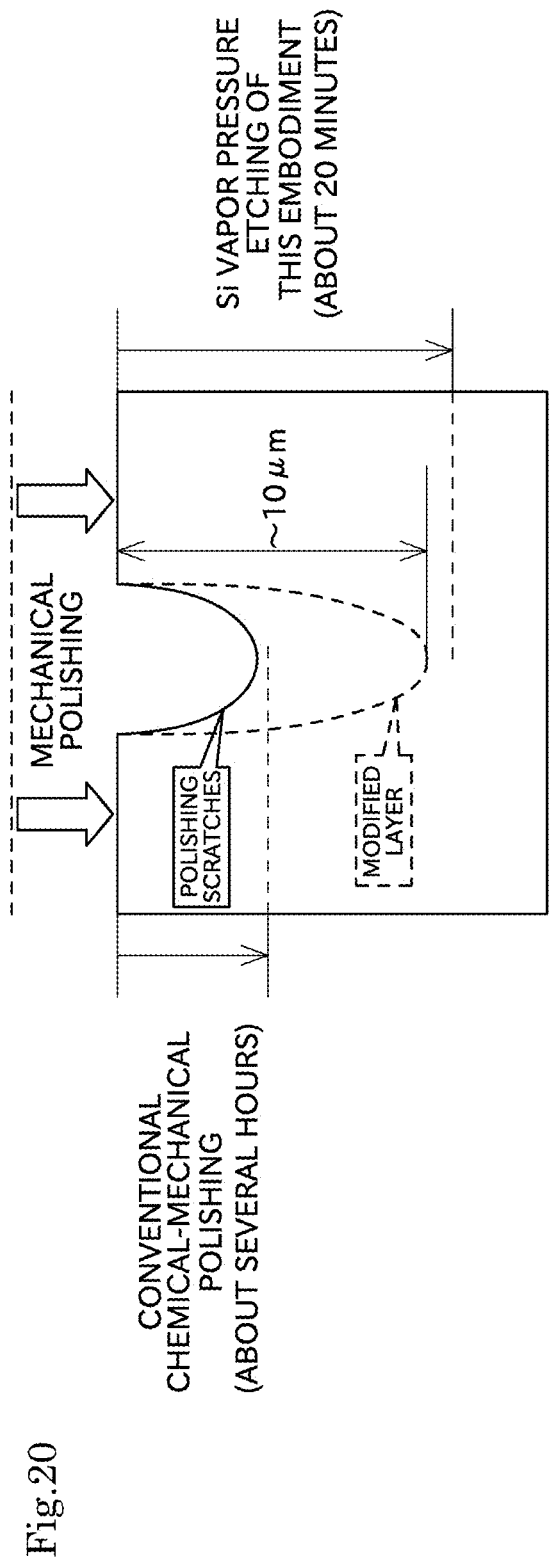
[FIG. 20] A diagram showing a schematic cross-section shape of a SiC single crystal substrate having polishing scratches and a modified layer caused by mechanical polishing, and the diagram showing a method and required time for removing polishing scratches and the modified layer.

As described above, however, the pressure is applied to the surface of substrate 70 during mechanical polishing, which causes mechanical distortion (generation of a modified layer). Due to an influence of this modified layer, as shown in photomicrograph of FIG. 6 (c), crystal defects are caused by latent scratches on the surface of the epitaxial layer 71. As shown in FIG. 20, the modified layer is generated 10000 nm from the surface of the substrate 70. Thus, chemical-mechanical polishing having low polish rate (about 2 nm/min), which takes eighty hours or more to remove the whole modified layer, is not practical.

The heat treatment using a CVD process allows a step of the substrate 70 to grow in the direction along the surface of the substrate. After that, ion implantation and activation of implanted-ion are performed on the substrate 70. However, even when these steps are performed, latent scratches are not removed. Since the substrate 70 has an off angle, heat treatment under high temperature during ion activation may cause further growth of a step of the substrate 70 and occurrence of macro-step bunching. The macro-step bunching is a phenomenon in which a plurality of SiC layers forms a bunch of steps (or a step formed by a plurality of SiC layers). Occurrence of this macro-step bunching causes an increase of surface roughness.

Occurrence of macro-step bunching may make the device structure of a semiconductor element unstable, or may cause a local concentration of an electric field to degrade the performance of the semiconductor element. The function as the semiconductor element may not be exerted due to an influence of latent scratches. A specific description will be given below, with reference to FIG. 21.

Figure 21:
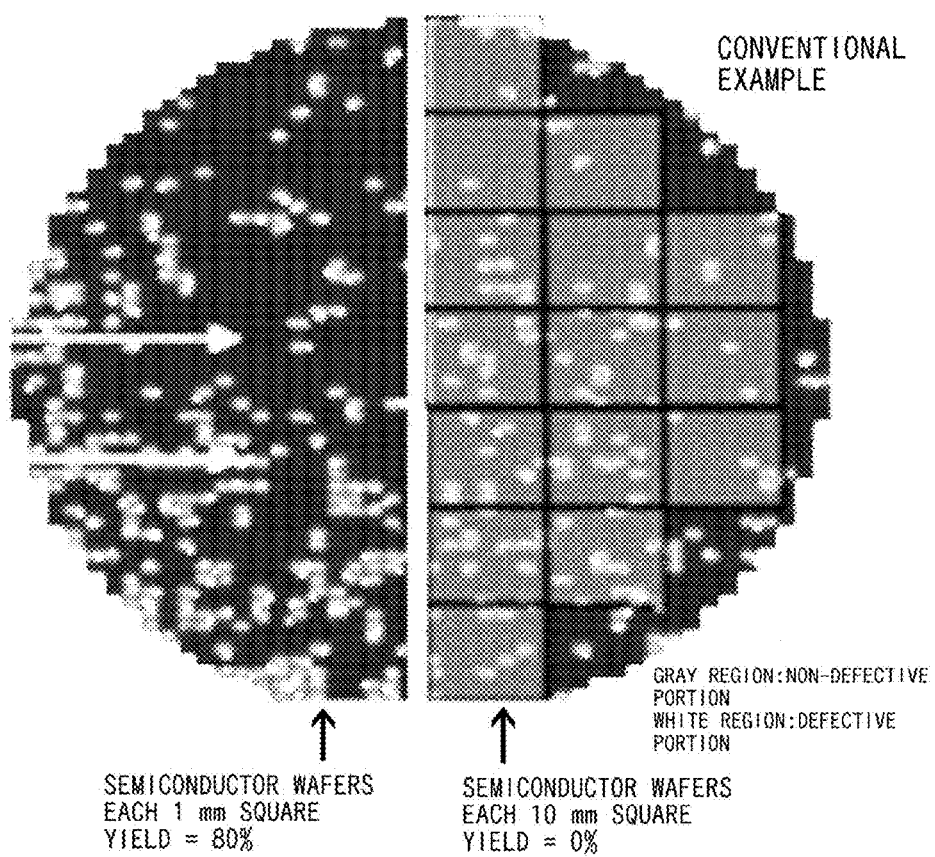
[FIG. 21] A diagram illustrating that latent scratches caused by mechanical polishing make a defect of a semiconductor wafer, and that this causes a considerable decrease in yield of a device having large chip size.

FIG. 21 shows two substrates having a non-defective portion (gray) or a defective portion (white) in each 1 mm square. The left side of FIG. 21 shows a case in which semiconductor wafers in 1 mm square are obtained from one substrate. In this case, a portion shown in gray is a non-defective product, and a portion shown in white is a defective product. An example of this diagram shows the yield of 80%.

The right side of FIG. 21 shows a case in which a semiconductor wafers in 10 mm square are obtained from one substrate. In this case, if all of 10 mm×10 mm portions are shown in gray, they can be the non-defective product. However, this diagram obviously shows that a 10 mm×10 mm portion that is non-defective does not exist. Thus, the yield is 0%. In the conventional method for manufacturing a semiconductor element, larger chip size of a semiconductor results in an increase in rate of defective products (a decrease in yield).

The following description will be given to the manufacturing method of this embodiment in which latent scratches and macro-step bunching can be removed by performing easy treatment at low cost. Firstly, an explanation will be given of the method for changing heat environment (in detail, Si pressure) using the above-described high-temperature vacuum furnace 11. FIG. 8 is a diagram showing the status of performing heat treatment under Si high-pressure atmosphere or Si low-pressure atmosphere.

As shown in FIG. 8, a silicon pellet 77 is supplied inside a crucible 2 when heat treatment is performed. Instead of the silicon pellet 77, silicon may be applied to the wall surface of the crucible 2. In this condition, changing the position of a lid 114 allows the degree of sealing in the crucible 2 to be changed. This enables to adjust Si pressure inside the crucible 2.

As shown in FIG. 8 (b), for example, a decrease in the degree of sealing in the crucible 2 allows heat treatment to be performed under Si low-pressure atmosphere. On the other hand, as shown in FIG. 8 (a), an increase in the degree of sealing in the crucible 2 allows heat treatment to be performed under Si high-pressure atmosphere. The degree of sealing in the crucible 2 can be finely adjusted so that heat treatment can be performed at a desired value of Si pressure.

Next, a specific step of this embodiment will be described. FIG. 9 and FIG. 10 are diagrams showing the former and latter half of a step of manufacturing a semiconductor element using a substrate having an off angle of 4° in this embodiment.

Cutting out of an off-angled substrate and mechanical polishing shown in FIG. 9 (a) are similar to a conventional technique. FIG. 9 and FIG. 10 show the method for manufacturing a semiconductor element using a substrate 70 having an off angle of 4°. More specifically, the surface of the substrate 70 is (0001) Si-face or (000-1) C-face, has an off angle of 4 degrees in the direction of <11-20>, and has an off angle of 4 degrees in the direction of <1-100> (see FIG. 11). In order to form an epitaxial layer efficiently by the following CVD process, an off angle is preferably, for example, about 4 degrees in the direction of <11-20> and <1-100>.

After that, chemical-mechanical polishing is conventionally performed. However, in this embodiment, heat treatment at 1800° C. or more and 2300° C. or less under Si high-pressure atmosphere (the condition of FIG. 8 (a)) is performed so that etching is performed on the surface of the substrate 70 (see a first removal step of FIG. 9 (b)). As a result of this heat treatment, SiC on the surface changes into $Si_2C$ or $SiC_2$ and they sublimes, so that the surface of the substrate 70 can be removed.

In this etching treatment, an increase in Si pressure in the crucible results in an increase in etching rate, as detailed later. For example, in a case of Si pressure of $5 \times 10^{-2}$ Pa in a vacuum of $10^{-1}$ Pa, etching rate (polish rate) of the substrate 70 is about 500 nm/min. As a result, the removal of the modified layer, which takes a lot of time eighty hours or more through a conventional method, can be completed in about twenty minutes. With this etching treatment (a first removal step), as shown in a photomicrograph of FIG. 9 (b), the surface of the substrate 70 is planarized to a molecular level.

Next, similarly to a conventional method, an epitaxial layer growth step is performed by a CVD process. In this embodiment, a modified layer is removed by a first removal step so that latent scratches or the like are not occurred, as shown in a photomicrograph of FIG. 9 (c). However, macro-step bunching having off angle shown in FIG. 11 may be occurred on the surface of the substrate 70.

Figure 11:
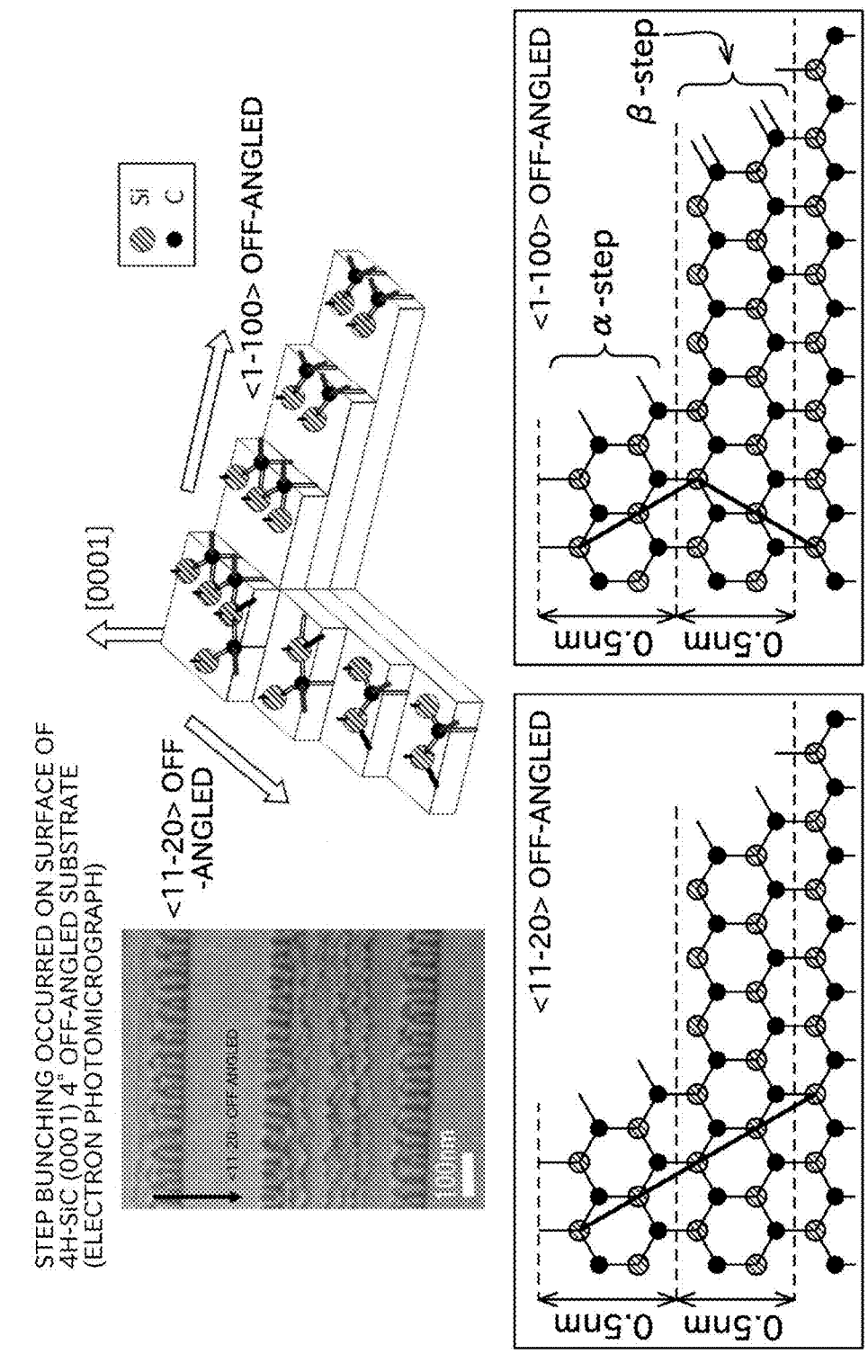
[FIG. 11] An atomic arrangement conceptual diagram illustrating the relationship between the shape of a surface of 4H—SiC (0001) single crystal substrate and an off angle, and a diagram illustrating a mechanism that macro-step bunching is occurred on the surface of a substrate when etching by heat treatment is performed.

As shown in FIG. 11, in a stepwise step end portion off-angled in the direction of <11-20>, carbon atom has always one unpaired electron (dangling bond) without depending on a stacked configuration of SiC single crystal. On the other hand, in a stepwise step end portion off-angled in the direction of <1-100>, two cases of one unpaired electron (α-step) or two unpaired electrons (β-step) are appeared in every two molecular layers with depending on the stacked configuration. In a case of heating SiC single crystal at high temperature, carbon atom existing in the step end portion is easily desorbed so that etching mechanism of the entire surface is controlled. Carbon atom of β-step is easier desorbed from the viewpoint of binding works, as compared with α-step. As a result, etching of β-step is earlier proceeded. β-step keeps up with α-step in due course, so that bunching which forms a bunch of steps is induced. This leads to a formation of a stable facet-face in energy. In the substrate off-angled at 4 degrees in the direction of <11-20>, the stability of a step end portion is provided as a group of small facets which expands from the direction of <11-20> to the direction of <1-100> shifted by 30°.

Next, an ion implantation step is performed on a substrate 70 that is an epitaxial layer 71 is formed. In the ion implantation step, ion implantation is performed on the substrate 70 that is the epitaxial layer 71 is formed. This ion implantation is performed by using an ion-doping apparatus having a function of irradiating an object with ion (for example, Al). A desired region of a semiconductor element is formed, based on an ion-implanted portion 72 in which ions are implanted.

Figure 12:
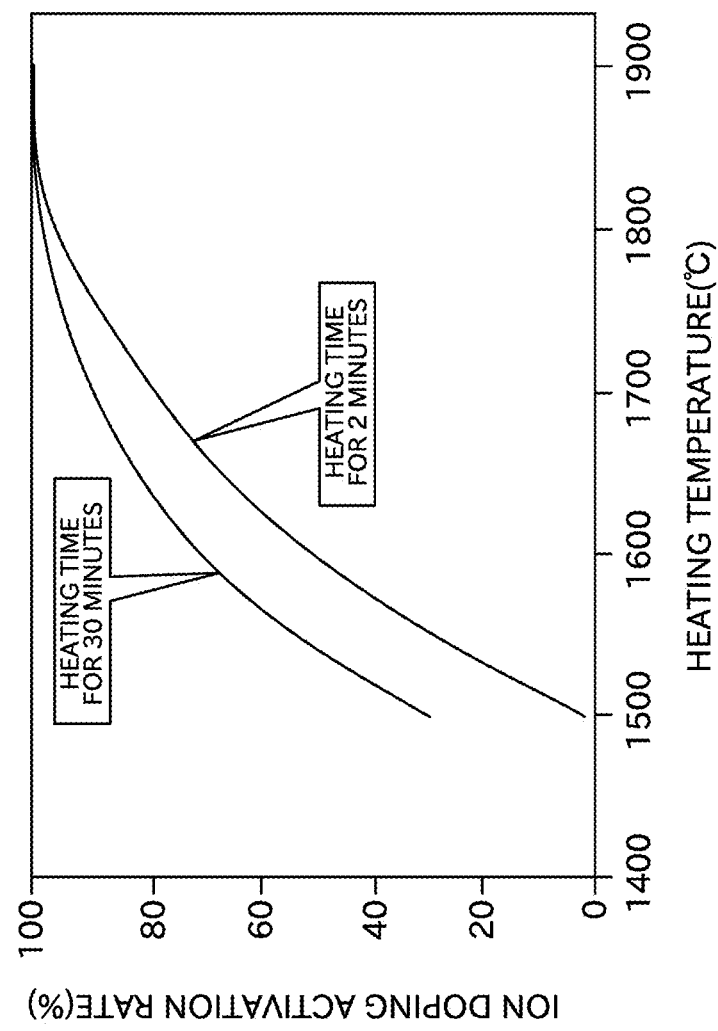
[FIG. 12] A graph showing the relationship between the activation rate of ion doping and heating temperature.

Next, an ion activation step is performed on the substrate 70 in which ions are implanted. In the ion activation step, heat treatment is performed at 1800° C. or more and 2300° C. or less under Si low-pressure atmosphere (the condition of FIG. 8 (b)). Heating ion at high temperature of 1800° C. or more, as shown in FIG. 12, enables to get the activation rate of 100% of ion doping. Additionally, since Si low-pressure atmosphere leads to low etching rate, etching the surface of the substrate 70 excessively during the ion activation can be prevented. In this embodiment, macro-step bunching is occurred, similarly to a conventional technique.

Next, a second removal step is performed on the substrate 70. In the second removal step, Si pressure is set at a predetermined value and then heat treatment is performed at 1600° C. or more and 2300° C. or less. The surface of the substrate 70 is etched by performing heat treatment in the same principle as a first removal step. Accordingly, as shown in a schematic view and a photomicrograph of FIG. 10 (f), macro-step bunching can be removed.

Next, an electrode formation step is performed on the substrate 70. In the electrode formation step, electrodes 73 having an oxide film of $SiO_2$ and SiON, a gate metal or the like is formed, in accordance with an ion-implanted portion formed on the surface of the substrate 70 during an ion implantation step. Accordingly, a semiconductor element (for example, a transistor) having a MOS (Metal Oxide Semiconductor) type can be manufactured. Any configuration is adoptable as long as the electrodes 73 can exert a function as the semiconductor element.

Though any method is adoptable for forming the electrodes 73, for example, oxidation by heating the substrate 70 under a dry oxygen can be used as the method for forming an oxide film. The gate metal is formed by vapor-deposition or the like. The electrode formation step can be continuously performed to at least the second removal step by using the high-temperature vacuum furnace 11 or the other apparatus as well.

Figure 13:
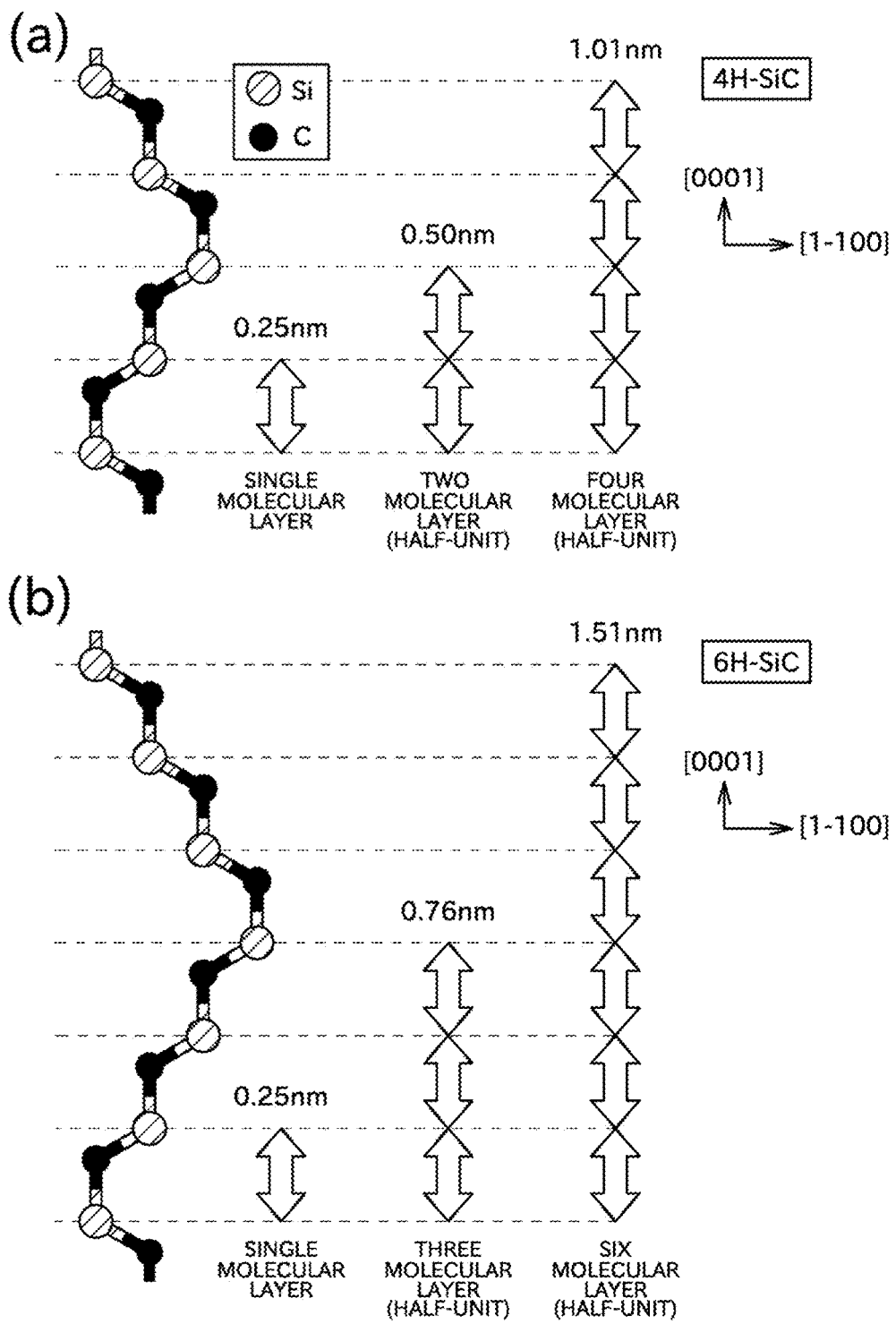
[FIG. 13] A schematic view for illustrating a molecular arrangement and a period of 4H—SiC single crystal and 6H—SiC single crystal.

In the second removal step, macro-step bunching is removed so that the surface of an epitaxial layer 71 is planarized and terminated at a step having a full-unit height that corresponds to one periodic of SiC molecules in a stack direction or a half-unit height that corresponds to one-half periodic. The "full-unit height" means the height corresponding to one periodic of a stack of SiC single molecular layers including Si and C with respect to a stack direction. Therefore, in a case of 4H—SiC, as shown in FIG. 13 (a), a step having the full-unit height means a step having a height of 1.01 nm. The "half-unit height" means the height corresponding to half the one periodic with respect to the stack direction. Therefore, in a case of 4H—SiC, as shown in FIG. 13 (a), a step having the half-unit height means a step having a height of 0.50 nm. In a case of 6H—SiC, as shown in FIG. 13 (b), a step having the full-unit height means a step having a height of 1.51 nm, and a step having the half-unit height means a step having a height of 0.76 nm.

Figure 14:
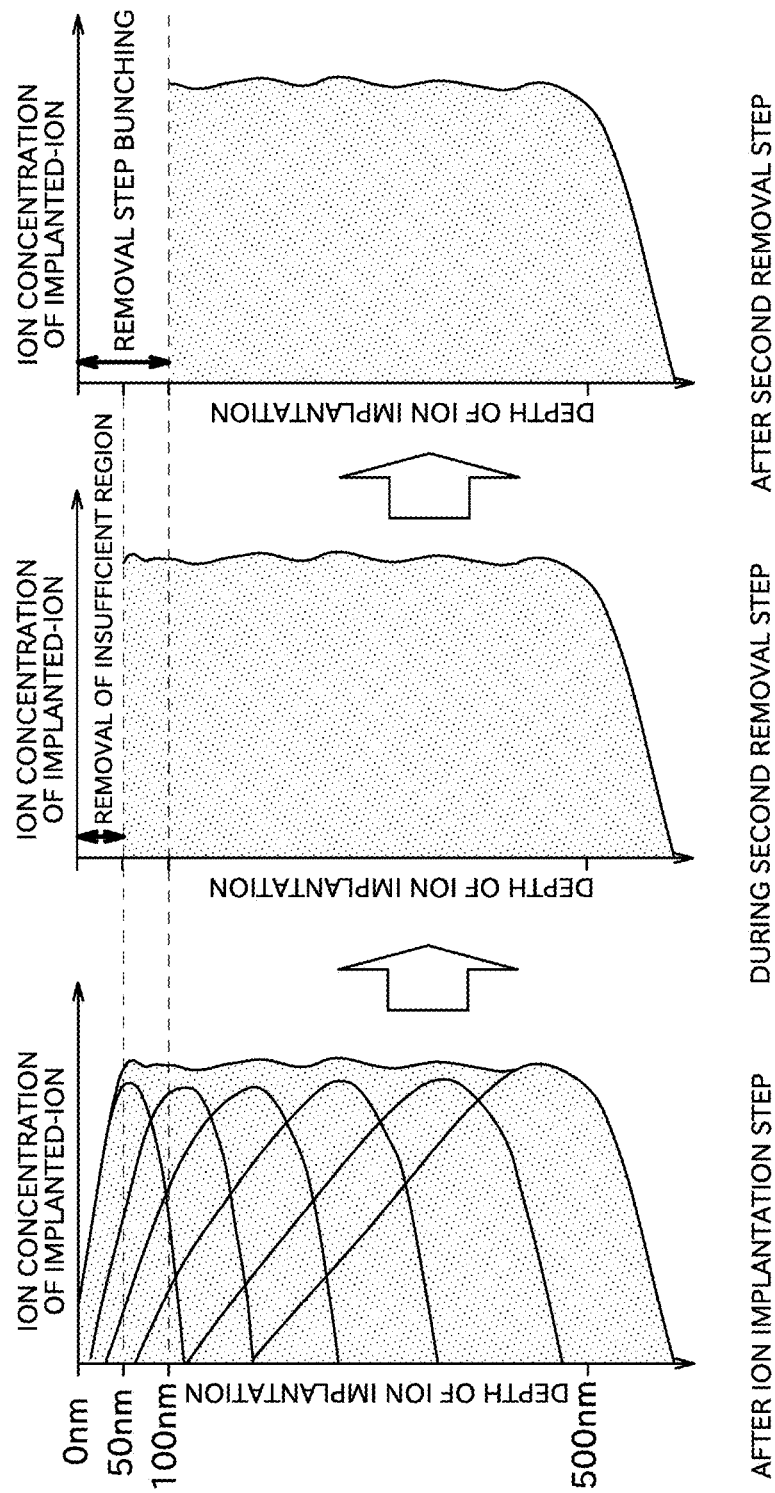
[FIG. 14] A schematic view conceptually showing the relationship between ion concentration of ion implanted on a substrate and the depth of ion implantation.

Next, etching in a second removal step will be described with reference to FIG. 14. FIG. 14 is a schematic view conceptually showing the relationship between ion concentration of ion implanted on a substrate 70 and the depth of ion implantation. As shown in FIG. 14, it can be found that ion concentration is insufficient at a range from the surface of an epitaxial layer 71 to 50 nm (insufficient region), on the other hand, ion concentration is sufficient at a range from 50 nm to 500 nm. It is also conventionally known that macro-step bunching is occurred at a range from the surface of the epitaxial layer 71 to several 10 nm.

Accordingly, in the second removal step, while the insufficient region and macro-step bunching are completely removed, the range of about 100 nm from the surface of the epitaxial layer 71 is etched in order to prevent excessively etching of the range having sufficiently ion concentration. Therefore, adjusting so as to perform etching in this range is needed. Etching in this range can obtain comfortable flatness of the epitaxial layer 71 (no macro-step bunching) and the region on the surface having sufficient ion concentration.

As described above, the steps shown in FIG. 9 and FIG. 10 are performed so that a semiconductor element using SiC can be manufactured.

Next, the method for manufacturing a semiconductor using a substrate 70 having a low off angle (for example, one degree) will be described. FIG. 15 and FIG. 16 are diagrams showing a step of manufacturing a semiconductor element using a substrate 70 having an off angle of one degree. In a case of a small off angle, an epitaxial layer 71 cannot be effectively formed through a CVD process. Alternatively, a metastable solvent epitaxy process (MSE process) is used.

A MSE process is a method in which: a substrate 70 made of single crystal SiC and operated as a seed substrate, and a carbon feed substrate 94 having a higher free energy according to the difference between potential of a chemical energy of materials than that of the substrate 70 are arranged opposed to each other, and a Si melt layer 93 serving as a solvent (carbon transfer medium) is interposed between the substrate 70 and the carbon feed substrate 94; and then, the substrate 70 and the carbon feed substrate 94 are subjected to a heat treatment under Si vapor pressure, thus causing an epitaxial growth of single crystal SiC on a surface of the substrate 70. The epitaxial layer 71 can be formed even when the substrate 70 has a small off angle.

In the other steps, the same treatment is performed as the case having an off angle of 4°, and therefore a description thereof will be omitted. Through the process thus far described, a semiconductor element can be manufactured using a substrate 70 having a small off angle.

Figure 17:
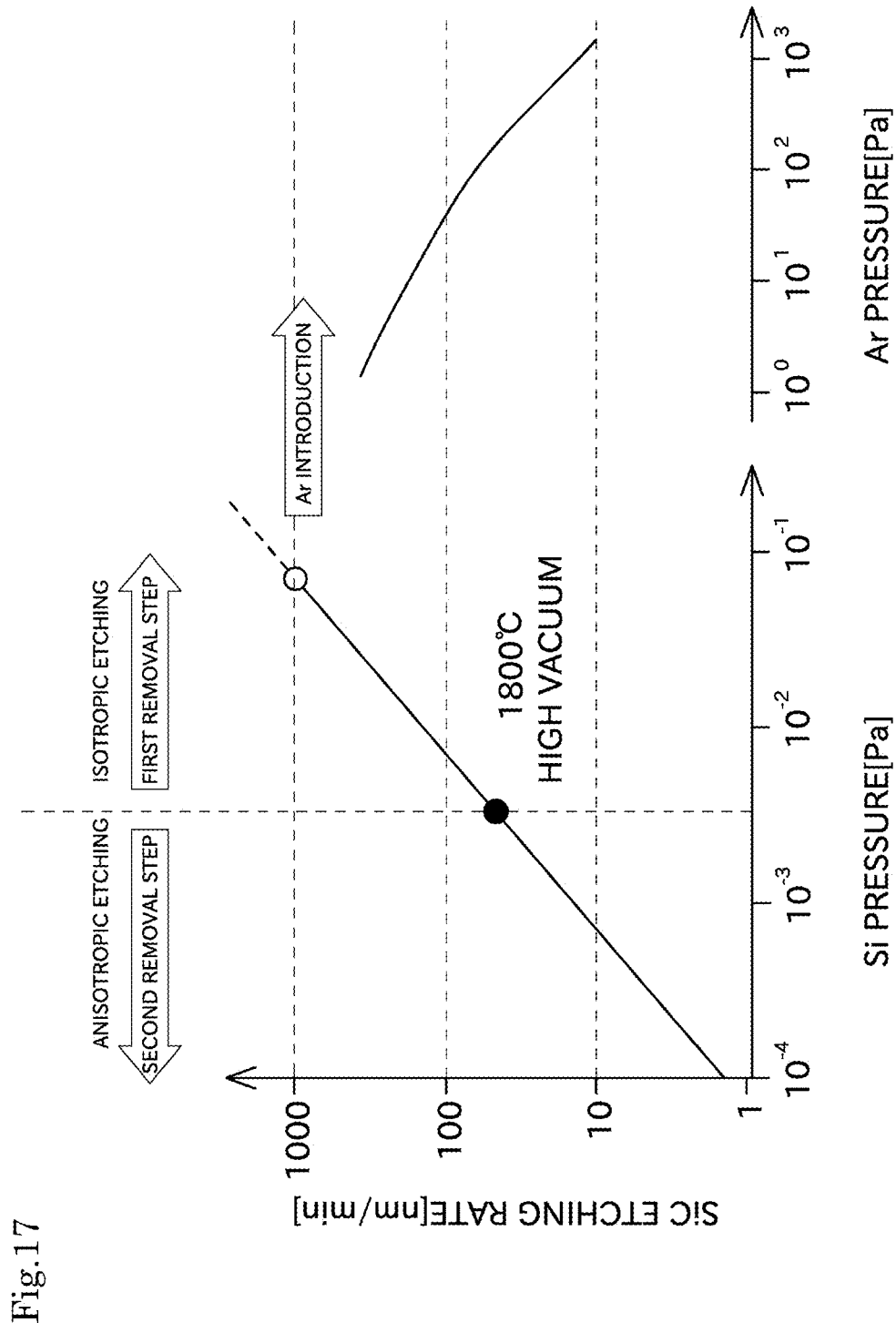
[FIG. 17] A diagram showing the characteristic of etching on a SiC substrate surface expressed when Si pressure is changed under high vacuum at a fixed temperature (for example, 1800° C.), the change of the characteristic of etching expressed when Ar is introduced (the relation with etching rate depended on Si partial pressure), and the conditions of a first removal step removing a modified layer of a surface of a SiC single crystal substrate depended on etching rate and a second removal step removing macro-step bunching.

Next, the relationship between Si pressure and etching rate of the substrate 70 will be described with reference to FIG. 17. The left side of a graph in FIG. 17 shows the change of etching rate when Si pressure under vacuum of $10^{-1}$ Pa is changed. This graph shows that the etching rate can be changed, for example, from 1 nm/min to 1000 nm/min by changing Si pressure.

In the high-temperature vacuum furnace 11 of this embodiment, moving the lid 114 of the crucible 2 allows Si pressure to be easily changed. This enables to easily change the etching rate in accordance with the condition.

For example, in the above-described first removal step, the high etching rate is preferable since about 10000 nm from the surface of the substrate 70 needs to be removed. In the first removal step, it is preferable that, for example, Si pressure is $10^{-2}$ Pa or more. In the above-described ion activation step, the low etching rate is preferable since excessive removal of the substrate 70 needs to be prevented. Thus, in the ion activation step, it is preferable that Si pressure is $10^{-3}$ Pa or less (for example, $10^{-4}$ Pa or more and $10^{-3}$ Pa or less). In the second removal step, it is preferable that about 100 nm from the surface of the substrate 70 is removed and also an excessive removal is prevented. Thus, in the second removal step, it is preferable that Si pressure is $10^{-3}$ Pa or less.

Next, the relationship between heating condition and the presence or absence of occurrence of macro-step bunching will be described with reference to FIG. 18 and FIG. 19.

Figure 18:
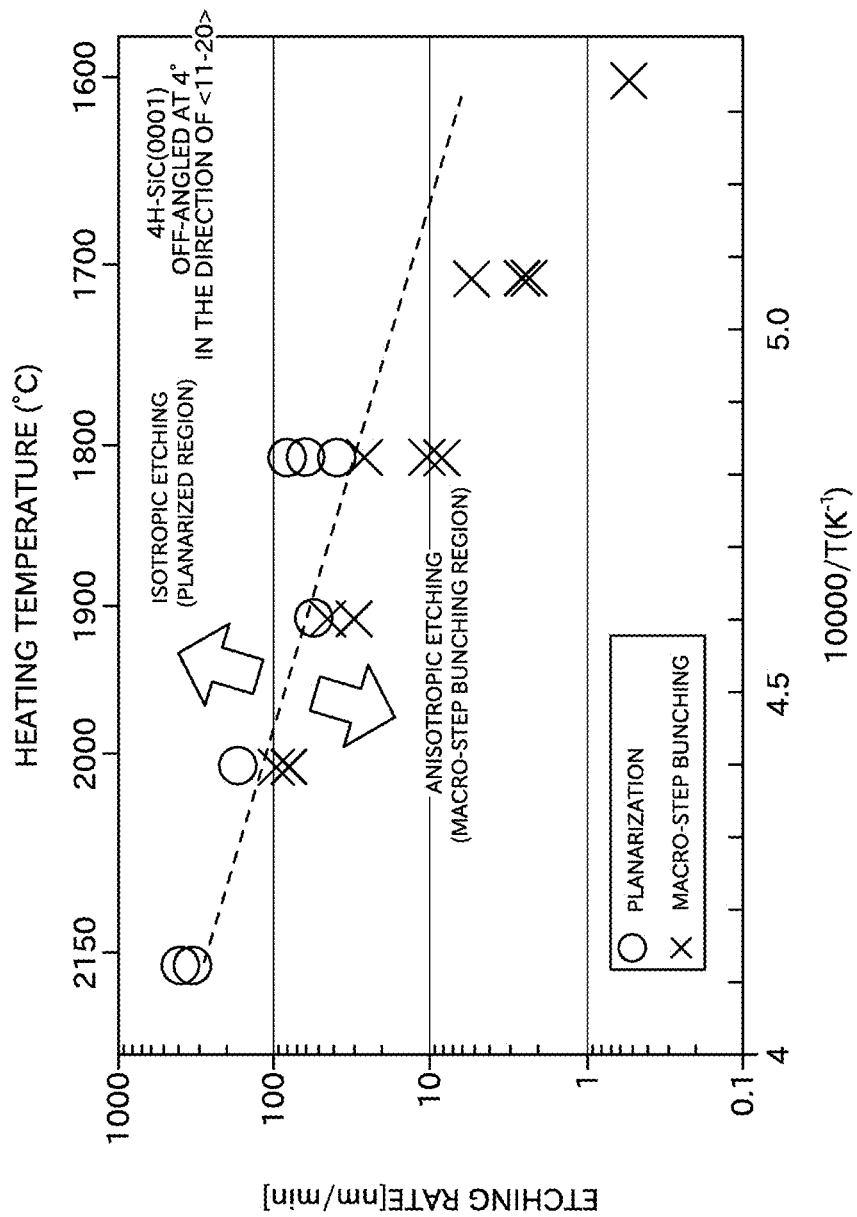
[FIG. 18] A graph showing etching rate depended on a Si pressure at the time of changing heating temperature, and the presence or absence of occurrence of macro-step bunching on a surface of an off-angled substrate (an off angle is 4° in the direction of [11-20]).

FIG. 18 is a graph showing the presence or absence of occurrence of macro-step bunching at a time of keeping Si pressure constant and changing the condition such as heating temperature. The graph of FIG. 18 shows the express of an isotropic etching in the region having high etching rate above a boundary line (a dashed line of FIG. 18), and the express of an anisotropic etching in the region having low etching rate below the boundary line. Breakdown of macro-step bunching is made in the region of the isotropic etching. That is, the graph of FIG. 18 shows that, in a case of logarithmically representing etching rate, macro-step bunching can be removed in a region above the boundary line and otherwise macro-step bunching cannot be removed in a region below the boundary line. As described above, the presence or absence of occurrence of macro-step bunching is related to heating condition (Si pressure, heating temperature, etching rate or the like). Heating condition is set by using this relationship so that occurrence of macro-step bunching can be prevented in the first removal step or macro-step bunching can be appropriately removed in the second removal step.

Figure 19:
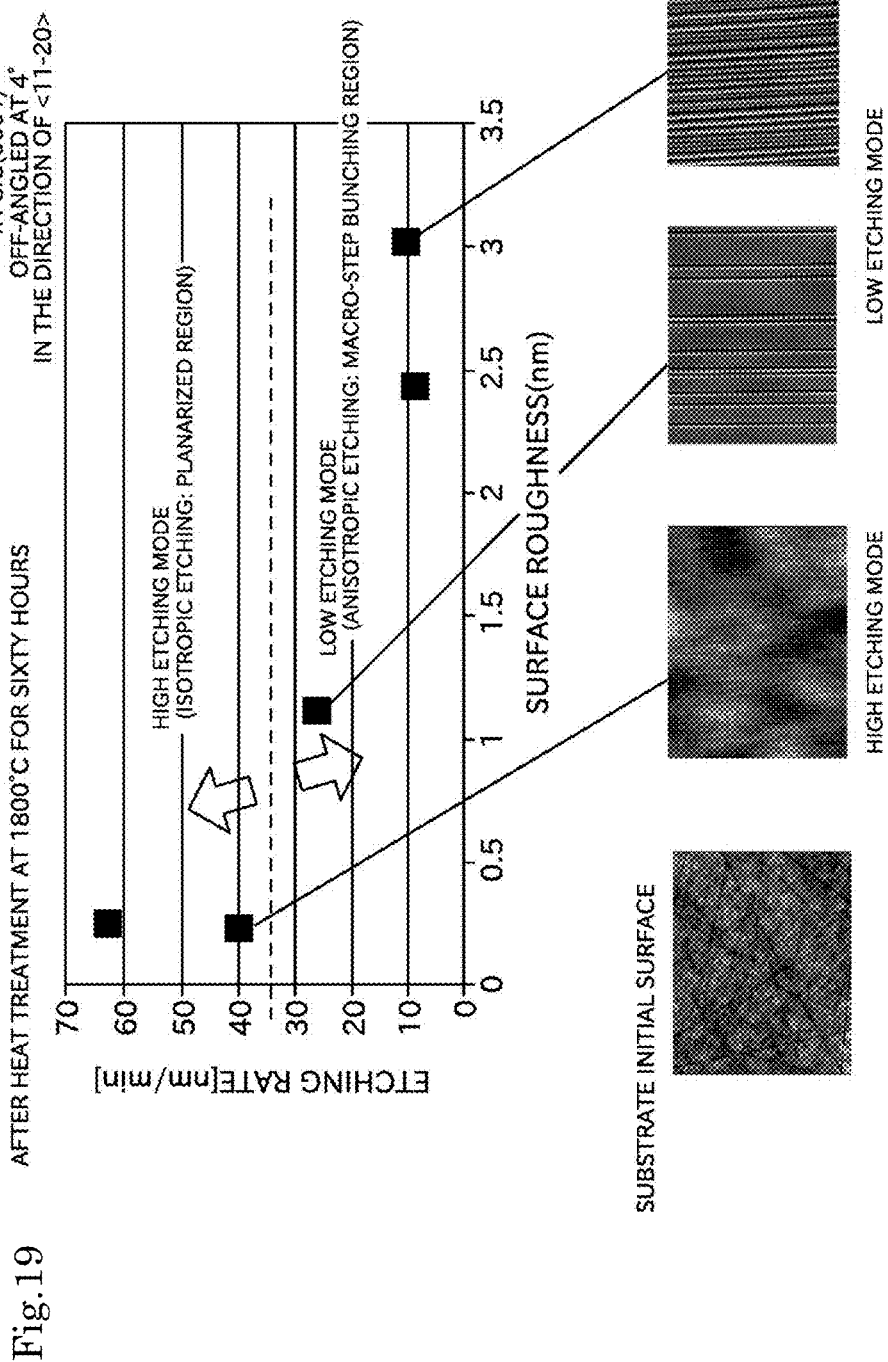
[FIG. 19] A graph showing the relationship between etching rate and the status of a SiC substrate surface under the condition of predetermined heating temperature and heating time.

FIG. 19 shows the relationship between etching rate and a status of a surface of a SiC substrate (the presence or absence of occurrence of macro-step bunching) when heat treatment at 1800° C. for sixty minutes is performed. It can be found from the graph of FIG. 19 that, in a case of low etching rate (low etching mode), macro-step bunching is not removed. On the other hand, in a case of high etching rate (high etching mode), breakdown of macro-step bunching can be made and occurrence of macro-step bunching can be suppressed.

As described above, a method for manufacturing a semiconductor element in this embodiment includes a first removal step, an epitaxial layer formation step, an ion implantation step, an ion activation step, a second removal step and an electrode formation step. In the first removal step, a modified layer produced by subjecting the substrate 70 to mechanical polishing is removed by heating the substrate 70 under Si vapor pressure. In the epitaxial layer formation step, an epitaxial layer 71 is formed on the substrate removed the modified layer. In the ion implantation step, ions are implanted in the epitaxial layer 71. In the ion activation step, ions are activated by heating the substrate 70. In the second removal step, an insufficient ion-implanted portion of the surface of the substrate 70 performed the ion activation step thereon and a macro-step bunching occurred on the surface of the substrate 70 during the ion activation step are removed by heating under Si vapor pressure. In the electrode formation step, electrodes are formed on the substrate 70 from which the insufficient ion-implanted portion and macro-step bunching are removed by the second removal step.

In the first removal step, removing the modified layer can prevents occurrence of latent scratches caused by crystal defects. This enables to improve a yield of the semiconductor element. Additionally, etching rate (polish rate) is high in the first removal step, and therefore the modified layer is removed in a short time and the production efficiency of the semiconductor element can be significantly improved.

Although a preferred embodiment of the present invention has been described above, the above-described configuration may be modified, for example, as follows.

Al is implanted in the ion implantation step of the above-described embodiment, however, B may be implanted instead of Al. In a case of forming n type of region, instead of Al, nitrogen or P (phosphorus) may be implanted.

The environment of the treatment, the single crystal SiC substrate used, and the like, are merely illustrative ones, and the present invention is applicable to various environments and various types of single crystal SiC substrates. For example, the heating temperature and the pressure are not limited to the values illustrated above, they can be changed as appropriate.

DESCRIPTION OF REFERENCE NUMERALS 2 crucible
11 high-temperature vacuum furnace
70 substrate
71 epitaxial layer
72 ion-implanted portion
73 electrode
114 lid

The invention claimed is:

1. A method for treating a surface of a substrate having an off angle, the surface of the substrate being SiC, the method comprising:
forming a modified layer within the substrate by applying pressure to the substrate;
a first removal step of removing the modified layer by heating the substrate under Si vapor pressure and performing isotropic etching based upon etching rate to reciprocal of heating temperature; and
wherein the surface of the substrate is single crystal SiC.

2. The method for treating the surface of the substrate according to claim 1, wherein
the first removal step is performed at the etching rate of 35 nm/min or more.

3. The method for treating the surface of the substrate according to claim 1, wherein
the first removal step is performed at the etching rate of about 100 nm/min or more.

4. The method for treating the surface of the substrate according to claim 1, wherein
in the first removal step, heating is performed in a temperature range of 1800° C. or more and 2300° C. or less and under Si vapor pressure of $10^{-2}$ Pa or more.

5. The method for treating the surface of the substrate according to claim 1, wherein
the surface of the substrate has an off angle of 4 degrees or less in the direction of <11-20> or <1-100>.

6. The method for treating the surface of the substrate according to claim 1, wherein
the surface of the substrate terminates at a step having a full-unit height that corresponds to one periodic of SiC molecules in a stack direction or a half-unit height that corresponds to one-half periodic thereof.

7. The method for treating the surface of the substrate according to claim 1, wherein
macro-step bunching does not occur when the isotropic etching is performed.

8. A method for manufacturing the substrate from which the modified layer has been removed, the method comprising the method for treating the surface of the substrate according to claim 1.

9. The method for manufacturing the substrate from which the modified layer has been removed according to claim 8, the method comprising:
performing an epitaxial layer formation step to form an epitaxial layer on the surface of the substrate from which the modified layer has been removed.

10. The method for manufacturing the substrate from which the modified layer has been removed according to claim 9, the method comprising:
in the epitaxial layer formation step, the epitaxial layer is formed using a chemical vapor deposition method or a liquid-phase epitaxial method.

11. The method for manufacturing the substrate from which the modified layer has been removed according to claim 9, the method comprising:
an ion implantation step of implanting ions on the epitaxial layer;
an ion activation step of activating ions by heating the substrate.

12. The method for manufacturing the substrate from which the modified layer has been removed according to claim 11, the method comprising:
in the ion activation step, heating is performed in a temperature range of 1800° C. or more and 2300° C. or less and under Si vapor pressure of $10^{31\ 3}$ Pa or less.

13. The method for manufacturing the substrate from which the modified layer has been removed according to claim 11, the method comprising:
forming an at least one insufficient ion-implanted portion of the surface of the substrate and a macro-step bunching on the surface of the substrate as a result of the ion activation step;
a second removal step of removing the at least one insufficient ion-implanted portion of the surface of the substrate and the macro-step bunching by heating the substrate under Si vapor pressure.

14. The method for manufacturing the substrate from which the modified layer has been removed according to claim 13, wherein
in the second removal step, an etching rate is lower than that of the first removal step.

15. The method for manufacturing the substrate from which the modified layer has been removed according to claim 13, wherein
the first removal step and the second removal step are continuously performed using a common heating apparatus.

16. The method for manufacturing the substrate from which the modified layer has been removed according to claim 13, wherein
in the second removal step, heating is performed in a temperature range of 1600° C. or more and 2000° C. or less and under Si vapor pressure of $10^{-3}$ Pa or less.

17. A method for manufacturing a semiconductor element, the method comprising:
the method for manufacturing the substrate from which the modified layer has been removed according to claim 13;
an electrode formation step of forming at least one electrode on the substrate from which the at least one insufficient ion-implanted portion and macro-step bunching have been removed by the second removal step.

* * * * *